US011653127B2

(12) United States Patent
Meißner et al.

(10) Patent No.: US 11,653,127 B2
(45) Date of Patent: May 16, 2023

(54) MONITORING VOLTAGE MEASUREMENTS FOR A VEHICLE BATTERY

(71) Applicant: WEBFLEET SOLUTIONS B.V., Amsterdam (NL)

(72) Inventors: Christian Meißner, Leipzig (DE); Martin Marenz, Leipzig (DE); Lydia Hopp, Leipzig (DE); Lily-Belle Sweet, Leipzig (DE); Paul Roeland Verheijen, Verheijen (NL)

(73) Assignee: Bridgestone Mobility Solutions B.V., Amsterdam (NL)

( * ) Notice: Subject to any disclaimer, the term of this patent is extended or adjusted under 35 U.S.C. 154(b) by 30 days.

(21) Appl. No.: 17/344,298

(22) Filed: Jun. 10, 2021

(65) Prior Publication Data
US 2021/0392416 A1 Dec. 16, 2021

(30) Foreign Application Priority Data

Jun. 10, 2020 (EP) .................... 20275105

(51) Int. Cl.
*H04Q 9/00* (2006.01)
*B60L 58/12* (2019.01)
(Continued)

(52) U.S. Cl.
CPC ............. *H04Q 9/00* (2013.01); *B60L 58/12* (2019.02); *G07C 5/008* (2013.01); *G07C 5/0841* (2013.01);
(Continued)

(58) Field of Classification Search
CPC ...... H04Q 9/00; H04Q 2209/84; B60L 58/12; H02J 7/00032; H02J 7/0063; G07C 5/008; G07C 5/0841
(Continued)

(56) References Cited

U.S. PATENT DOCUMENTS 7,218,118 B1 * 5/2007 Gonring ............. G01R 31/3647
320/132
10,385,815 B1 * 8/2019 Dudar ................... B60W 20/40
(Continued)

FOREIGN PATENT DOCUMENTS

CN 203020100 U 6/2013
CN 109523758 3/2019
(Continued)

OTHER PUBLICATIONS

International Search Report: European Search Report for corresponding European Application No. EP 21 17 8888 dated Sep. 2021, 11 pages.
(Continued)

*Primary Examiner* — Zhen Y Wu
(74) *Attorney, Agent, or Firm* — Patterson Intellectual Property Law PC; Gary L. Montle

(57) ABSTRACT

A server (16) arranged to automatically detect replacement of a vehicle battery (6) associated with a vehicle engine (5) comprises: a communications device (20) configured to receive vehicle battery voltage measurements from a telematics device (10) connected to or incorporating a voltage monitoring unit for the vehicle battery (6); and one or more processors (18) configured to process the vehicle battery voltage measurements. The processor(s) (18) monitor the voltage measurements in a first time window corresponding to an engine off state and assess when the voltage measurements in the first time window indicate a step change in voltage magnitude at a given time. The step change is then used to automatically identify a vehicle battery replacement event.

16 Claims, 17 Drawing Sheets

(51) Int. Cl.
  *H02J 7/00* (2006.01)
  *G07C 5/00* (2006.01)
  *G07C 5/08* (2006.01)
(52) U.S. Cl.
  CPC ........ *H02J 7/00032* (2020.01); *H02J 7/0063* (2013.01); *H04Q 2209/84* (2013.01)
(58) Field of Classification Search
  USPC .................................................. 340/870.07
  See application file for complete search history.

(56) References Cited

U.S. PATENT DOCUMENTS

| | | | |
|---|---|---|---|
| 10,594,145 B1* | 3/2020 | Wang | G01R 31/392 |
| 11,187,753 B2* | 11/2021 | Gupta | H01M 10/4285 |
| 2007/0069734 A1 | 3/2007 | Bertness | |
| 2007/0216407 A1* | 9/2007 | Yamaguchi | G01R 31/3648 |
| | | | 324/256 |
| 2008/0268896 A1* | 10/2008 | Langlois | G08C 21/00 |
| | | | 455/550.1 |
| 2009/0099802 A1* | 4/2009 | Barsoukov | G01R 31/3648 |
| | | | 702/65 |
| 2009/0128157 A1* | 5/2009 | Moriya | G01R 31/3842 |
| | | | 324/426 |
| 2009/0146664 A1 | 6/2009 | Zhang | |
| 2009/0265125 A1 | 10/2009 | Zhang | |
| 2010/0026306 A1 | 2/2010 | Zhang et al. | |
| 2011/0082621 A1 | 4/2011 | Berkobin et al. | |
| 2014/0214311 A1 | 7/2014 | Stevens et al. | |
| 2015/0147607 A1* | 5/2015 | Fukuhara | H01M 10/482 |
| | | | 429/61 |
| 2017/0016962 A1 | 1/2017 | Iwane et al. | |
| 2018/0065636 A1 | 3/2018 | Fabregas et al. | |
| 2018/0183252 A1* | 6/2018 | Kim | H02J 7/0029 |
| 2018/0201151 A1* | 7/2018 | Dudar | G01R 31/3647 |
| 2018/0236890 A1 | 8/2018 | Cyrne | |
| 2019/0265303 A1* | 8/2019 | Yamada | G01R 31/392 |
| 2019/0353710 A1* | 11/2019 | Rocci | G01R 31/3648 |
| 2019/0385386 A1 | 12/2019 | Davidson | |
| 2020/0280108 A1* | 9/2020 | Tomar | H01M 10/4257 |
| 2021/0248844 A1* | 8/2021 | Gunderson | G07C 5/006 |
| 2021/0255247 A1* | 8/2021 | Alleva | G07C 5/0816 |
| 2022/0026492 A1* | 1/2022 | Verheijen | G01R 31/392 |

FOREIGN PATENT DOCUMENTS

| | | |
|---|---|---|
| EP | 2404792 A1 | 9/2010 |
| GB | 2557073 A | 6/2018 |
| WO | 0004620 A2 | 1/2000 |
| WO | 2016022659 A1 | 2/2016 |

OTHER PUBLICATIONS

Intellectual Property Office: Search Report for corresponding GB Application No. 1820073.3 dated May 31, 2019, 4 pages.
International Search Authority: European Patent Office Search Report for corresponding International Application No. PCT/EP2019/084523, dated Mar. 9, 2020, 5 pages.
International Bureau of WIPO: International Preliminary Report of Patentability for corresponding application PCT/2019/0824523, dated Jun. 8, 2021, 12 pages.
Thomas, Pete, et al: "Identifying the causes of road crashes in Europe", 57th AAAM Annual Conference, Annals of Advances in Automotive Medicine (Sep. 22-25, 20213), 10 pages.
Grube, Ryan J.: "Automotive Battery State-of-Health Monitoring Methods," (2008) Wright State University CORE Scholar (Theses and Dissertations) , 117 pages.
Rune, Prytz: "Machine learning methods for vehicle predictive maintenance using off-board and on-board data," Halmstad University Dissertations No. 9, 96 pages.
Buller, Stephan, et al.: "Impedance-based non-linear dynamic battery modeling for automotive applications," Journal of Power Sources (2003), pp. 422-430, 10 pages.
Karden, Eckhard, et al.: Electrochemical modelling of lead/acid batteries under operating conditions of electric vehicles, Journal of Power Sources (1997), pp. 175-180, 6 pages.
Ruetschi, Paul: "Aging mechanisms and service life of lead-acid batteries," Journal of Power Sources (2004) 33-44, 12 pages.
Coleman, M., et al.: "A Combined SOC Estimation Method Under Varied Ambient Temperature for a Lead-Acid Battery," Power Electroics Research Centre,National University of Ireland, Galway, Ireland, 7 pages.
Meissner, Eberhard, et al.: "Vehicle electric power systems are under change! Implications for deign, monitoring and management of automotive batteries," Journal of Power Sources 95 (2001), 13-23, 11 pages.
Suozzo, Christopher (2008). Lead-Acid Battery Aging and State of Health Diagnosis (Thesis) The Ohio State University, 142 pages.
Omar, Noshin, et al.: "Peukert Revisisted—Critical Appraisal and Need for Modification for Lithium-Ion Batteries," Energies (2013) 6, 5625-5641; doi:10.3390/en6115625 ISSN 1996-1073, www.mdpi.com/journal/energies, 17 pages.
Roberts, Anrew, et al.: Internal combustion engine cold-start efficiency: A review of the problem,causes and potential solutions. Energy Conversion and Management 82 (2014) 327-350, 24 pages.
International Search Authority: European Search Report for corresponding European Patent Application No. EP20275105 dated Dec. 11, 2020, 11 pages.

\* cited by examiner

MONITORING VOLTAGE MEASUREMENTS FOR A VEHICLE BATTERY

TECHNICAL FIELD

The present invention relates to methods that involve monitoring battery voltage measurements for a vehicle battery, e.g. associated with an internal combustion engine, wherein the battery voltage measurements are obtained from a voltage measuring unit connected to or incorporated into a telematics device.

BACKGROUND

Telematics devices, commonly known as a telematics control unit (TCU), are used in the management of vehicle fleets. A TCU such as one of the LINK devices available from Webfleet Solutions may be installed in vehicles to track their positions and collect vehicle data for analysis. This enables a fleet manager to view real-time vehicle location for the complete fleet on a map, as well as being provided with information concerning driving behaviour and vehicle diagnostics.

By connecting a voltage monitoring unit of a telematics device to a vehicle battery, it is also possible to achieve remote insight into battery health. The health status of a vehicle battery may be used to determine whether the battery may not have enough charge to start the vehicle. The fleet manager may therefore be alerted to a no-start condition being predicted for an individual vehicle, for example as disclosed in US2010/0026306. This can prevent the driver from being confronted with a battery issue only when battery failure occurs, e.g. during the first cold days of winter. What is meant by battery failure is an event where the power train of a vehicle is no longer able to provide the necessary power to crank the combustion engine.

When assessing battery health, typically various parameters need to be input manually based on vehicle history, in particular the battery age or date of last battery replacement. This relies on manually keeping track of how old is each battery of the fleet and the last battery replacement date being provided by the driver, the garage staff, or the fleet manager. There remains a need for a way of automatically detecting when a vehicle battery is replaced.

Moreover, battery health assessments ideally take into account a variety of factors including driving behaviour and the vehicle charging system (alternator), as these factors are known to affect the state of charge of the battery. There remains a need for automatically detecting various health-related events and state-related events in general for a vehicle battery.

SUMMARY OF THE INVENTION

According to a first aspect of the present invention, there is provided a method of automatically detecting replacement of a vehicle battery associated with an internal combustion engine, the method comprising:
  obtaining vehicle battery voltage measurements from a voltage monitoring unit connected to or incorporated into a telematics device;
  processing the vehicle battery voltage measurements by:
  monitoring the voltage measurements in a first time window corresponding to an engine off state;
  assessing when the voltage measurements in the first time window indicate a step change in voltage magnitude at a given time; and
  using the step change to automatically identify a vehicle battery replacement event.

Such methods are able to automatically identify when a vehicle battery has been replaced without any need for input from the vehicle's driver or owner. By monitoring the battery voltage measurements in the first time window corresponding to an engine off state, the resting voltage profile of the battery is being monitored. What is meant by the resting voltage profile is the vehicle battery voltage as a function of time as measured in an engine off state (rather than the vehicle being at rest or standstill with the engine on e.g. at traffic lights). When a battery is replaced with a different one, a step change in the resting voltage magnitude is observed. This step change may be positive or negative. Different batteries may have different resting voltage profiles due to different ages (typically the resting voltage decays faster as the battery degrades over time) or two batteries of the same age may have different resting voltage profiles because they come from different manufacturers or have experienced different charging patterns during use. In at least some embodiments, monitoring the voltage measurements in the first time window comprises determining a resting voltage profile as a function of time from voltage measurements in the first time window.

It will be appreciated that the voltage monitoring unit may be any suitable monitoring device connected, either directly or indirectly, to the vehicle battery to take measurements of the vehicle battery voltage. In some embodiments, the voltage monitoring unit may comprise electric circuity of the vehicle that is connected to the telematics device. In some embodiments, alternatively or in addition, the voltage monitoring unit may be incorporated into a telematics device. The telematics device may be physically connected to an appropriate data monitoring port in the vehicle such as an On-Board Diagnostics (OBD) port. The purpose of the telematics device is to channel the vehicle battery voltage measurements for processing, as is described further below.

In some embodiments the telematics device may include its own power supply such as an onboard battery. In other embodiments the telematics device is connected to the vehicle battery to take a power supply from the battery. It has been recognised that an interruption in the power supply from the battery can be used to verify when the voltage monitoring unit of the telematics device is disconnected from the vehicle battery during a battery replacement event. Thus, in at least some embodiments wherein the telematics device is connected to the vehicle battery to take a power supply from the battery, the method further comprises: registering an interruption in the power supply from the battery and assessing whether the step change at a given time coincides with the interruption in the power supply to verify the battery replacement event. In such embodiments, it may be verified that a battery replacement event has taken place if the step change at a given time coincides with the interruption in the power supply. Optionally, the method may further comprise applying a time stamp upon detecting an interruption in the power supply and using the time stamp as the given time of the step change. This provides a reliable approach to automatically identifying a battery replacement event, even if the step change is relatively small. An interruption in the power supply may also arise if the telematics device is disconnected from the vehicle. However, when the telematics device is reconnected there should not be a step change in the resting voltage magnitude or resting voltage profile. The voltage measurements from before and after disconnection of the telematics device may be used to verify that a battery replacement event has not taken place.

It will be understood that a step change in voltage magnitude can be defined as a significant jump in magnitude compared to an average or mean value of the voltage magnitude in the first time window. For example, a step change may be assessed as a change of at least 5%, 10%, 20%, 30%, or more, as compared to the average or mean value of the voltage magnitude. In at least some embodiments, the step change in voltage magnitude is compared with a threshold value to determine whether to automatically identify a battery replacement event. The threshold value may be a preset value (e.g. 0.5 V or 1.0 V for a 12 V battery) or a value that is set dynamically based on the average or mean value of the voltage magnitude. As described above, in at least some embodiments the step change is a step change in the resting voltage magnitude (i.e. measured in an engine off state). The resting voltage typically varies between 11 V and 13.5 V for a 12 V vehicle battery, and between 22 V and 28 V for a 24 V vehicle battery, depending on the battery model and age.

However, it will be appreciated that the method may not be able to tell apart a battery replacement event from a battery recharge event, as both events involve a step change in the voltage magnitude. In order to assess whether a battery has been replaced by a different one, rather than simply recharged, the voltage measurements can be exploited further so as to build up a voltage profile before and after a suspected battery replacement event. It has now been recognised that comparing before and after voltage profiles can be a powerful way of verifying battery replacement. This approach can be applied independently of registering an interruption in the power supply from the battery or a disconnection of the telematics device.

In one or more embodiments, monitoring the voltage measurements in the first time window comprises determining a first voltage profile as a function of time from voltage measurements in multiple instances of the first time window. In other words, the first voltage profile is built up from voltage measurements taken during several engine off periods. The multiple instances of the first time window are likely to be temporally separate engine off periods, separated by cranking and engine on i.e. driving periods. This means that the first voltage profile can provide an accurate representation of how the battery voltage normally changes over time in the first time window, with statistical variations being smoothed out by determining the first voltage profile from voltage measurements in multiple instances of the first time window. It has been found that the first voltage profile is characteristic of any given battery, which means that comparing the first voltage profile before and after a suspected battery replacement event can verify whether the battery is the same one that has been recharged or whether the battery has been replaced by a different one (which may even be the same or similar age).

In one or more embodiments, the method further comprises: comparing the first voltage profile determined before the given time of the step change with the first voltage profile determined after the given time of the step change; and identifying a discernible change in the first voltage profile before and after the given time of the step change to identify a different battery and verify the battery replacement event. The identification of a discernible change in the first voltage profile therefore indicates that the battery has been replaced by a different battery rather than recharged.

In some embodiments, the method may comprise only monitoring the voltage measurements in the first time window corresponding to an engine off state. Such limited voltage monitoring can be sufficient for the purposes of automatically identifying a battery replacement event, as described above. Furthermore, limiting the time periods when voltage measurements are obtained can reduce the processing power required and avoid the unnecessary transmission of data (e.g. when the telematics device is transmitting the voltage measurements to a remote server for processing).

However, it has been recognised that determining one or more further voltage profiles in other time windows corresponding to different vehicle states can be highly informative when assessing whether a battery replacement event has occurred. In particular, if a battery were to be replaced with another of the same make and similar age then it may be difficult to tell such replacement apart from a recharging event.

In one or more embodiments, the method further comprises: determining a second voltage profile as a function of time from voltage measurements in multiple instances of a second time window corresponding to an engine cranking state and/or determining a third voltage profile as a function of time from voltage measurements in multiple instances of a third time window corresponding to an engine on state; comparing the second and/or third voltage profile determined before the given time of the step change with the second and/or third voltage profile determined after the given time of the step change; and identifying a discernible change in the second and/or third voltage profile before and after the given time of the step change to identify a different battery and verify the battery replacement event. Thus any discernible change in the second and/or third voltage profile may be used to verify a suspected battery replacement event, either in combination with a before and after comparison of the first voltage profile, or as an alternative.

It has been further recognised that combining multiples one of the first, second and/or third voltage profiles can give an overview of the battery's characteristic behaviour and state of health which acts like a signature enabling one battery to be differentiated from another. In one or more embodiments, the method further comprises: aggregating the first voltage profile with the second and/or third voltage profile to determine an overall battery voltage profile; comparing the overall battery voltage profile before the given time of the step change with the overall battery voltage profile after the given time of the step change; and identifying one or more discernible changes in the overall battery voltage profile before and after the given time of the step change to identify a different battery and verify the battery replacement event. The overall battery voltage profile therefore represents how the battery voltage typically varies as a function of time across the different time windows, encompassing different engine states, to give a signature unique to the battery. This overall battery voltage profile can be fed into standard machine learning methods to distinguish whether the battery before and after a suspected replacement event is the same one, or whether the battery has been changed or exchanged.

In one or more embodiments, the method further comprises: using one or more machine learning or statistical analysis methods to identify one or more discernible changes in a voltage profile before and after the given time of the step change to identify a different battery and verify the battery replacement event. Such machine learning or statistical analysis techniques may be applied when comparing any one or more of the first, second or third voltage profiles before and after the given time of the step change. If the voltage profiles before and after are statistically matched then a battery replacement event is not verified. It may be determined that the battery was recharged rather than replaced.

In one or more of the embodiments described above, the discernible change in the voltage profile may relate to one or more characteristics of the voltage profile. In various embodiments, the discernible change relates to one or more of: a change in minimum resting voltage, a change in auto-discharge rate for the battery, or a change in at least one cranking characteristic. The relevant voltage profile characteristics may be determined by the applicable time window. For example, in some embodiments the method comprising identifying a discernible change in minimum resting voltage for the first voltage profile determined in the first time window corresponding to an engine off state. For example, in addition or alternatively, in some embodiments the method comprising identifying a discernible change in auto-discharge rate for the battery. A change in auto-discharge rate may be relevant for the first voltage profile, determined in the first time window corresponding to an engine off state, and/or for the third voltage profile, determined in the third time window corresponding to an engine on state. For example, in addition or alternatively, in some embodiments the method comprising identifying a discernible change in a cranking characteristic for the second voltage profile determined in the second time window corresponding to an engine cranking state.

In various of the embodiments described above, the method comprises building up voltage profiles during engine off periods, and optionally during cranking/driving periods, and comparing voltage profiles before and after the given time of the step change. A statistical comparison can be made to identify discernible changes that verify a battery replacement event occurred at the given time. However, it has been found that determining one or more voltage profiles is not essential. The method may simply assess when the voltage measurements indicate a step change in voltage magnitude by determining a mean or average resting voltage in the first time window (i.e. when the vehicle is in an engine off state). Taking into account that the voltage measurements in the first time window typically fall in magnitude from an initial value to a minimal resting voltage after a certain rest period (as the surface charge accumulated during driving wears off), this approach may look at a mean value for the minimal resting voltage. What is meant by the minimal resting voltage is the minimum value measured for the resting voltage in any given instance of the first time period, i.e. in any given resting period when the engine is off.

Thus, in one or more embodiments, monitoring the voltage measurements in the first time window comprises: determining a minimal resting voltage in each instance of the first time window, calculating a mean value for the minimal resting voltage from multiple instances of the first time window, and assessing when there is a step change in the mean value. As is described above, a step change may be assessed as a change of at least 5%, 10%, 20%, 30%, or more. Optionally, the step change in the mean value is compared with a threshold value to determine whether to automatically identify a battery replacement event. The threshold value may be a preset value (e.g. 0.5 V or 1.0 V for a 12 V battery) or a value that is set dynamically based on the mean value at any given time.

Many of the embodiments described above determine one or more voltage profiles as a function of time to provide a characteristic signature for a battery, with discernible changes in a voltage profile then being used to verify a battery replacement event. Alternatively, it will be appreciated that this approach may instead be used to automatically identify a battery replacement event, even if a step change in voltage magnitude was not detected. There may be some circumstances when a battery has been replaced without a step change being seen in the voltage measurements. According to a second aspect of the present invention, there is provided a method of automatically detecting replacement of a vehicle battery associated with an internal combustion engine, the method comprising:

obtaining vehicle battery voltage measurements from a voltage monitoring unit connected to or incorporated into a telematics device;

processing the vehicle battery voltage measurements by:

determining a voltage profile as a function of time for at least one given time window chosen from a first time window corresponding to an engine off state, a second time window corresponding to an engine cranking state, and a third time window corresponding to an engine on state;

assessing when the voltage profile undergoes a discernible change over a time period corresponding to multiple instances of the given time window; and using the discernible change to automatically identify a vehicle battery replacement event.

In some embodiments of this second aspect of the invention, the method may further comprise: aggregating multiple voltage profiles determined for the first, second and/or third time windows to determine an overall battery voltage profile; comparing the overall battery voltage profile before the identified battery replacement event with the overall battery voltage profile after the identified battery replacement event; and identifying one or more discernible changes in the overall battery voltage profile before and after the identified battery replacement event to verify the battery replacement event.

In some embodiments of this second aspect of the invention, the method may further comprise: using one or more machine learning or statistical analysis methods to identify one or more discernible changes in a voltage profile before and after the identified battery replacement event to verify the battery replacement event.

In some embodiments of this second aspect of the invention, the discernible change relates to one or more of: a change in minimum resting voltage, a change in auto-discharge rate for the battery, or a change in a cranking characteristic. As described above, the relevant voltage profile characteristics may be determined by the applicable time window. The examples described above apply equally.

In addition to using a discernible change in one or more voltage profiles to automatically identify a battery replacement event, it has been recognised that this approach may in fact enable a wide range of different health-related or state-related events for a vehicle battery to be automatically identified. Discernible changes in battery voltage profiles can be appropriately classified and linked to other events that have an effect on the battery's function. For example, voltage profiles may be used to automatically detect when: a battery has been replaced; one or a set of multiple cranking attempts failed; a battery is not charging or discharging as expected (e.g. due to alternator issues); a battery has discharged or degraded (e.g. due to detrimental driving behaviour). This approach can be assisted by machine learning or statistical analysis methods, as already mentioned above.

According to a further aspect of the present invention, there is provided a method of monitoring a voltage of a vehicle battery, the method comprising:

obtaining vehicle battery voltage measurements regularly from a voltage monitoring unit connected to or incorporated into a telematics device, so as to monitor the vehicle battery voltage at all times, regardless of vehicle use; and processing the vehicle battery voltage measurements by:

determining a voltage profile as a function of time for multiple time windows comprising a first time window corresponding to an engine off state, a second time window corresponding to an engine start-up state, and a third time window corresponding to an engine on state;

assessing, for each of the first, second and third time windows, when the voltage profile as a function of time for a given one of the first, second and third time windows undergoes a discernible change over a time period corresponding to multiple instances of the given time window; and using the discernible change to automatically identify a state-related event for the vehicle battery.

It will be appreciated that this method determines a battery voltage profile as a function of time for multiple time windows and therefore gives an overview of the battery's behaviour which represents a characteristic signature. By looking for discernible changes in the voltage profile at all times, regardless of vehicle use, it is possible to automatically identify a range of state-related events for the vehicle battery. It has not previously been recognised how monitoring the battery voltage at all times provides a powerful tool for detecting when there are influences having an effect on battery voltage behaviour.

A method according to this further aspect of the present invention may be used to monitor a voltage of any vehicle battery, including one or more batteries of an electric vehicle (EV) or plug-in hybrid electric vehicle (PHEV). In such vehicles, the battery may be recharged by a DC-DC converter rather than an alternator. The engine start-up state may be any state in which the engine undergoes a transition from the engine off state (vehicle at rest) to the engine on state (vehicle driving). However, in at least some embodiments the method is monitoring a voltage of a vehicle battery associated with an internal combustion engine. In such embodiments, the engine start-up state may be an engine cranking state.

It will be understood that a discernible change as disclosed herein means a change that is both statistically significant and can be discerned from long-term changes expected from normal battery ageing. A discernible change might be a sudden change or a gradual change, but one which indicates an influence on the battery voltage behaviour beyond the usual influences expected from the operating environment e.g. battery age, temperature, etc.

It will be understood that obtaining battery voltage measurements regularly means at regular intervals (e.g. at least once every one or two hours) regardless of whether the engine is off, being cranked, or the engine is on during driving. The frequency at which the voltage measurements are obtained may be constant or variable. For example, voltage measurements may be obtained more frequently when the engine is on during driving (e.g. at any rate between 1 to 60 minutes, or at least every 1, 5, 10, or 15 minutes) and even more frequently during start-up or cranking (e.g. at a rate of at least 50 Hz, at least 100 Hz, or even higher), as compared to when the engine is off and the vehicle is resting. In an engine off state, voltage measurements may be obtained at a rate of at least once every hour, two hours, three hours or four hours.

In one or more embodiments, each voltage profile may be determined from voltage measurements in multiple instances of the time window, e.g. several start-ups or crankings, or several engine off/on periods. It may take multiple instances of each time window for the voltage profile to provide a reliable representation of the battery's usual behaviour, allowing a discernible change to be identified at a statistical level.

In one or more embodiments, the method further comprises: aggregating the voltage profiles determined for each of the first, second and third time windows to determine an overall battery voltage profile; comparing the overall battery voltage profile determined from historical battery voltage measurements with the overall battery voltage profile determined from current battery voltage measurements; and identifying one or more discernible changes in the overall battery voltage profile to automatically identify a state-related event for the vehicle battery. The overall battery voltage profile therefore represents how the battery voltage typically varies as a function of time across the different time windows, encompassing different engine states, to give a signature unique to the battery. This overall battery voltage profile can be fed into standard machine learning methods to assess when one or more characteristics of the voltage profile are diverging from the usual profile, indicating a state-related event.

In one or more embodiments, assessing the voltage profile for each of the first, second and third time windows comprises using one or more machine learning or statistical analysis methods to recognise a discernible change and classify each discernible change according to its effect on a given voltage profile. In such embodiments, the discernible change is optionally classified as one of: a change in auto-discharge rate for the battery in one of more of the first, second and third time windows; a change in minimum resting voltage in the first time window; a change relating to an ongoing reduction in mean or minimum resting voltage in the first time window; a step change in voltage magnitude in the first time window; a change relating to at least one start-up or cranking characteristic in the second window; a change relating to a reduction in voltage magnitude in the third time window; or a change relating to a continuous negative gradient in the voltage profile in the third time window.

In addition, or alternatively, in such embodiments classification of the discernible change is used to automatically identify a state-related event for the vehicle battery chosen from: a different battery; a different battery health state; a problematic engine start attempt event for the battery; a charging or discharging issue; an alternator malfunction; a DC-DC converter malfunction; or a battery replacement event.

Some specific examples are given below for classification of the discernible change(s) and the state-related event(s) expected to have such an effect on a given voltage profile.

In a first set of examples, the discernible change is classified as a change in auto-discharge rate for the battery in one of more of the first, second and third time windows, which is used to automatically identify a different battery health state or a different battery.

In a second set of examples, the discernible change is classified as a change in the mean or minimum resting voltage in the first time window, which is used to automatically identify a different battery.

In a third set of examples, the discernible change is classified as an ongoing reduction in mean or minimum resting voltage in the first time window, which is used to automatically identify a different battery health state. A different battery health state may result from problematic driving behaviour (e.g. short trips don't allow for the battery to recharge so its state of charge has a downwards trend). In some such examples, the last measured voltage for a preceding instance of the first time window may be compared with the first measured voltage for a following instance of the first time window. Optionally this is repeated for multiple instances of the first time window.

In a fourth set of examples, the discernible change is classified as a change relating to a cranking characteristic in the second window, which is used to automatically identify a different battery health state or a different battery. In some such examples, the cranking characteristic comprises at least one of a voltage drop magnitude during cranking and a cranking duration.

In a fifth set of examples, the discernible change is classified as a change relating to a start-up or cranking characteristic in the second window, which is used to automatically identify a problematic engine start attempt event for the battery. In some such examples, the cranking characteristic comprises at least one of the number of voltage drops during cranking, the cranking duration, the voltage achieved by cranking, and a cranking success/failure classification.

In a sixth set of examples, the discernible change is classified as a change relating to a reduction in voltage magnitude in the third time window, which is used to automatically identify an alternator malfunction (for ICE vehicles) or DC-DC converter malfunction (for EVs/PHEVs). In some such examples, the reduction in voltage magnitude may be assessed with reference to threshold, preferably a dynamic threshold. Optionally the threshold is defined by a minimum resting voltage taken from the voltage profile as a function of time for the first time window.

In a seventh set of examples, the discernible change is classified as a change relating to a continuous negative gradient in the voltage profile in the third time window, which is used to automatically identify an alternator malfunction or DC-DC converter malfunction.

In addition to any of the examples disclosed above, or as an alternative, the method may further comprise: determining when the vehicle has not been used over a significant time period (e.g. a period of n days in which you would normally see multiple instances of engine on/off), using the voltage profile for the first time window to predict a future change in voltage profile for the first time window, and to use the predicted future change in voltage profile to issue an advance warning of a start-up problem. This approach allows for detection of problematic long resting periods, which result in auto-discharge of the battery.

In one or more embodiments of any aspect of the invention disclosed above, the method further comprises: generating a notification of a battery replacement event or other state-related event. In at least some embodiments, the method further comprises: transmitting the notification to one or more devices associated with the vehicle (optionally via the telematics device), with a driver of the vehicle (e.g. a driver's mobile device), and/or with a vehicle fleet manager (e.g. a fleet manager display device).

In those embodiments using one or more machine learning or statistical analysis methods to identify one or more discernible changes in a voltage profile, standard methods may be applied. Some examples of standard methods include Gaussian-Mixture-Models, Multivariate-T-Student Test, Neural Networks, Cluster-based Local Outlier Factor, Histogram-based Outlier Detection, Isolation Forest, K-Nearest Neighbours, and the like. For example, the method may comprise performing a t-test identify one or more discernible changes in a voltage profile. Reference may be made to standard textbooks, such as: The Hundred-Page Machine Learning Book, Andriy Burkov, 2019, Amazon Distribution; Deep Learning (Adaptive Computation and Machine Learning series), Ian Goodfellow, Zoshua Bengio, and Aaron Courville, 2016, The MIT Press; The LION Way: Machine Learning plus Intelligent Optimization, Roberto Battiti and Mauro Brunato, LIONlab, Version 3.0 December 2017, University of Trento.

In any of the aspects and embodiments disclosed herein, the method is a computer-implemented method.

In any of the aspects and embodiments disclosed herein, the methods may be used with any vehicle battery associated with an internal combustion engine (ICE), whether in a traditional ICE vehicle or a hybrid vehicle. The vehicle battery may be connected to an alternator to allow the battery to be recharged when the vehicle is driving. In hybrid vehicles, one or more combined motor/generator(s) may charge a storage battery and replace the separate alternator and starter motor usually found in ICE vehicles. In any of the aspects and embodiments disclosed herein, the methods may be used with any vehicle battery in a road vehicle.

In any of the aspects and embodiments disclosed herein, the methods may obtain voltage measurements from a voltage monitoring unit of a telematics device that is associated with the vehicle permanently or temporarily. As mentioned above, the telematics device may comprise a battery as an autonomous power source, or the telematics device may be connected to the vehicle battery to take a power supply from the battery. The voltage monitoring unit may take voltage measurements from the battery in any suitable way. For example, the voltage monitoring unit may be connected to a power wire of the vehicle, optionally via the Controller Area Network (CAN) bus commonly used as an in-vehicle data network. For example, the voltage monitoring unit may comprise an analogue to digital converter (ADC) of the telematics device. It will be understood that battery voltage measurements as disclosed herein can be any measurements indicative of the battery voltage. The battery voltage measurements may not be direct measurements of voltage.

There is further disclosed herein a server arranged to automatically detect replacement of a vehicle battery associated with an internal combustion engine, the server comprising:
  a communications device configured to receive vehicle battery voltage measurements from a telematics device connected to or incorporating a voltage monitoring unit for the vehicle battery; and
  one or more processors configured to process the vehicle battery voltage measurements by:
  monitoring the voltage measurements in a first time window corresponding to an engine off state;
  assessing when the voltage measurements in the first time window indicate a step change in voltage magnitude at a given time; and
  using the step change to automatically identify a vehicle battery replacement event.

There is further disclosed herein a system for automatically detecting replacement of a vehicle battery associated with an internal combustion engine, the system comprising:
  a telematics device connected to or incorporating a voltage monitoring unit for the vehicle battery, a processor and a transceiver; and a server arranged to receive vehicle battery voltage measurements from the telematics device;
wherein the server is configured (e.g. using a processor) to process the vehicle battery voltage measurements by:
monitoring the voltage measurements in a first time window corresponding to an engine off state;
assessing when the voltage measurements in the first time window indicate a step change in voltage magnitude at a given time; and
using the step change to automatically identify a vehicle battery replacement event.

The server and/or the system disclosed above may optionally include any of the features already described in relation to embodiments of the corresponding method.

Electric Vehicles (EVs) and Plug-In Hybrid Electric Vehicles (PHEVs) have two types of batteries: a high-voltage battery pack which is responsible for delivering power to the drivetrain, and a low-voltage (12V or 24V) battery which powers the electric components (lights, electronic systems, etc.). There are two types of batteries in EVs and PHEVs for cost and safety reasons. 12V batteries are much cheaper than high voltage battery packs which may have voltages of 200-800V.

Starting an engine in traditional ICE vehicles is one of the largest stress factors for batteries in these vehicles. However, the low voltage batteries in EVs and PHEVs also age and degrade. Particularly during long periods where vehicles are not in use, the self-discharge of the low voltage battery in EVs/PHEVs may harm the integrity of this low voltage battery. Even when the EV/PHEV is plugged in, the low-voltage battery will discharge and may therefore require replacement at some point.

Therefore, according to a further aspect of the present invention, there is provided a method of automatically detecting replacement of a vehicle battery associated with an engine of a vehicle, the method comprising:
obtaining vehicle battery voltage measurements from a voltage monitoring unit connected to or incorporated into a telematics device;
processing the vehicle battery voltage measurements by:
monitoring the voltage measurements in a first time window corresponding to an engine off state;
assessing when the voltage measurements in the first time window indicate a step change in voltage magnitude at a given time; and
using the step change to automatically identify a vehicle battery replacement event.

The engine may be the engine of an Electric Vehicle (EV)/Plug-in Hybrid Electric Vehicle (PHEV). Such a method is able to automatically identify when a vehicle battery (such as a low-voltage battery in an EV/PHEV) has been replaced without any need for input from the vehicle's driver or owner. By monitoring the battery voltage measurements in the first time window corresponding to an engine off state, the resting voltage profile of the battery is monitored. What is meant by the resting voltage profile is the vehicle battery voltage as a function of time as measured in an engine off state. When a battery is replaced with a different one, a step change in the resting voltage magnitude is observed. This step change may be positive or negative. As explained previously, different batteries may have different resting voltage profiles due to different ages (typically the resting voltage decays faster as the battery degrades over time) or two batteries of the same age may have different resting voltage profiles because they come from different manufacturers or have experienced different charging patterns during use. In at least some embodiments of the method described above, monitoring the voltage measurements in the first time window comprises determining a resting voltage profile as a function of time from voltage measurements in the first time window.

It will be appreciated that the voltage monitoring unit may be any suitable monitoring device connected, either directly or indirectly, to the vehicle battery to take measurements of the vehicle battery voltage. In some embodiments, the voltage monitoring unit may comprise electric circuitry of the vehicle that is connected to the telematics device. In some embodiments, alternatively or in addition, the voltage monitoring unit may be incorporated into a telematics device. The telematics device may be physically connected to an appropriate data monitoring port in the vehicle such as an On-Board Diagnostics (OBD) port. The purpose of the telematics device is to channel the vehicle battery voltage measurements for processing, as is described further below.

In some embodiments the telematics device may include its own power supply such as an onboard battery. In other embodiments the telematics device is connected to the vehicle battery to take a power supply from the battery. It has been recognised that an interruption in the power supply from the battery can be used to verify when the voltage monitoring unit of the telematics device is disconnected from the vehicle battery during a battery replacement event. Thus, in at least some embodiments wherein the telematics device is connected to the vehicle battery to take a power supply from the battery, the method further comprises: registering an interruption in the power supply from the battery and assessing whether the step change at a given time coincides with the interruption in the power supply to verify the battery replacement event. In such embodiments, it may be verified that a battery replacement event has taken place if the step change at a given time coincides with the interruption in the power supply. Optionally, the method may further comprise applying a time stamp upon detecting an interruption in the power supply and using the time stamp as the given time of the step change. This provides a reliable approach to automatically identifying a battery replacement event, even if the step change is relatively small. An interruption in the power supply may also arise if the telematics device is disconnected from the vehicle. However, when the telematics device is reconnected there should not be a step change in the resting voltage magnitude or resting voltage profile. The voltage measurements from before and after disconnection of the telematics device may be used to verify that a battery replacement event has not taken place.

It will be understood that a step change in voltage magnitude can be defined as a significant jump in magnitude compared to an average or mean value of the voltage magnitude in the first time window. For example, a step change may be assessed as a change of at least 5%, 10%, 20%, 30%, or more, as compared to the average or mean value of the voltage magnitude. In at least some embodiments, the step change in voltage magnitude is compared with a threshold value to determine whether to automatically identify a battery replacement event. The threshold value may be a preset value (e.g. 0.5 V or 1.0 V for a 12 V battery) or a value that is set dynamically based on the average or mean value of the voltage magnitude. As described above, in at least some embodiments the step change is a step change in the resting voltage magnitude (i.e. measured in an engine off state). The resting voltage typically varies between 11 V and 13.5 V for a 12 V vehicle battery, and between 22 V and 28 V for a 24 V vehicle battery, depending on the battery model and age.

However, it will be appreciated that the method may not be able to tell apart a battery replacement event from a battery recharge event, as both events involve a step change in the voltage magnitude. In order to assess whether a battery has been replaced by a different one, rather than simply recharged, the voltage measurements can be exploited further so as to build up a voltage profile before and after a suspected battery replacement event. It has now been recognised that comparing before and after voltage profiles can be a powerful way of verifying battery replacement. This approach can be applied independently of registering an interruption in the power supply from the battery or a disconnection of the telematics device.

In one or more embodiments, monitoring the voltage measurements in the first time window comprises determining a first voltage profile as a function of time from voltage measurements in multiple instances of the first time window. In other words, the first voltage profile is built up from voltage measurements taken during several engine off periods. The multiple instances of the first time window are likely to be temporally separate engine off periods, separated by engine on i.e. driving periods. This means that the first voltage profile can provide an accurate representation of how the battery voltage normally changes over time in the first time window, with statistical variations being smoothed out by determining the first voltage profile from voltage measurements in multiple instances of the first time window. It has been found that the first voltage profile is characteristic of any given battery, which means that comparing the first voltage profile before and after a suspected battery replacement event can verify whether the battery is the same one that has been recharged or whether the battery has been replaced by a different one (which may even be the same or similar age).

In one or more embodiments, the method further comprises: comparing the first voltage profile determined before the given time of the step change with the first voltage profile determined after the given time of the step change; and identifying a discernible change in the first voltage profile before and after the given time of the step change to identify a different battery and verify the battery replacement event. The identification of a discernible change in the first voltage profile therefore indicates that the battery has been replaced by a different battery rather than recharged.

In some embodiments, the method may comprise only monitoring the voltage measurements in the first time window corresponding to an engine off state. Such limited voltage monitoring can be sufficient for the purposes of automatically identifying a battery replacement event, as described above. Furthermore, limiting the time periods when voltage measurements are obtained can reduce the processing power required and avoid the unnecessary transmission of data (e.g. when the telematics device is transmitting the voltage measurements to a remote server for processing).

However, it has been recognised that determining one or more further voltage profiles in other time windows corresponding to different vehicle states can be highly informative when assessing whether a battery replacement event has occurred. In particular, if a battery were to be replaced with another of the same make and similar age then it may be difficult to tell such a replacement apart from a recharging event.

In one or more embodiments, the method further comprises: determining a second voltage profile as a function of time from voltage measurements in multiple instances of a second time window corresponding to an engine start-up state and/or determining a third voltage profile as a function of time from voltage measurements in multiple instances of a third time window corresponding to an engine on state; comparing the second and/or third voltage profile determined before the given time of the step change with the second and/or third voltage profile determined after the given time of the step change; and identifying a discernible change in the second and/or third voltage profile before and after the given time of the step change to identify a different battery and verify the battery replacement event. Thus any discernible change in the second and/or third voltage profile may be used to verify a suspected battery replacement event, either in combination with a before and after comparison of the first voltage profile, or as an alternative. The data for EV/PHEV voltage profiles does not include any engine cranking phase since, for EVs/PHEVs, there is no cranking phase and thus no cranking characteristics can be measured.

It has been further recognised that combining multiples one of the first, second and/or third voltage profiles can give an overview of the battery's characteristic behaviour and state of health which acts like a signature enabling one battery to be differentiated from another. In one or more embodiments, the method further comprises: aggregating the first voltage profile with the second and/or third voltage profile to determine an overall battery voltage profile; comparing the overall battery voltage profile before the given time of the step change with the overall battery voltage profile after the given time of the step change; and identifying one or more discernible changes in the overall battery voltage profile before and after the given time of the step change to identify a different battery and verify the battery replacement event. The overall battery voltage profile therefore represents how the battery voltage typically varies as a function of time across the different time windows, encompassing different engine states, to give a signature unique to the battery. This overall battery voltage profile can be fed into standard machine learning methods to distinguish whether the battery before and after a suspected replacement event is the same one, or whether the battery has been changed or exchanged. It will be appreciated that such machine learning or statistical analysis methods being applied for EVs or PHEVs may be different to those applied for ICE vehicles since there will be different input data (relating to the vehicle battery voltage measurements) for the different types of vehicles.

In one or more embodiments, the method further comprises: using one or more machine learning or statistical analysis methods to identify one or more discernible changes in a voltage profile before and after the given time of the step change to identify a different battery and verify the battery replacement event. Such machine learning or statistical analysis techniques may be applied when comparing any one or more of the first, second or third voltage profiles before and after the given time of the step change. If the voltage profiles before and after are statistically matched then a battery replacement event is not verified. It may be determined that the battery was recharged rather than replaced.

In one or more of the embodiments described above, the discernible change in the voltage profile may relate to one or more characteristics of the voltage profile. In various embodiments, the discernible change relates to one or more of: a change in minimum resting voltage, or a change in auto-discharge rate for the battery. The relevant voltage profile characteristics may be determined by the applicable time window. For example, in some embodiments the method comprising identifying a discernible change in minimum resting voltage for the first voltage profile determined in the first time window corresponding to an engine off state. For example, in addition or alternatively, in some embodiments the method comprising identifying a discernible change in auto-discharge rate for the battery. A change in auto-discharge rate may be relevant for the first voltage profile, determined in the first time window corresponding to an engine off state, and/or for the third voltage profile, determined in the third time window corresponding to an engine on state.

In various of the embodiments described above, the method comprises building up voltage profiles during engine off periods, and optionally during engine start-up/driving periods, and comparing voltage profiles before and after the given time of the step change. A statistical comparison can be made to identify discernible changes that verify a battery replacement event occurred at the given time. However, it has been found that determining one or more voltage profiles is not essential. The method may simply assess when the voltage measurements indicate a step change in voltage magnitude by determining a mean or average resting voltage in the first time window (i.e. when the vehicle is in an engine off state). Taking into account that the voltage measurements in the first time window typically fall in magnitude from an initial value to a minimal resting voltage after a certain rest period (as the surface charge accumulated during driving wears off), this approach may look at a mean value for the minimal resting voltage. What is meant by the minimal resting voltage is the minimum value measured for the resting voltage in any given instance of the first time period, i.e. in any given resting period when the engine is off.

Thus, in one or more embodiments, monitoring the voltage measurements in the first time window comprises: determining a minimal resting voltage in each instance of the first time window, calculating a mean value for the minimal resting voltage from multiple instances of the first time window, and assessing when there is a step change in the mean value. As is described above, a step change may be assessed as a change of at least 5%, 10%, 20%, 30%, or more. Optionally, the step change in the mean value is compared with a threshold value to determine whether to automatically identify a battery replacement event. The threshold value may be a preset value (e.g. 0.5 V or 1.0 V for a 12 V battery) or a value that is set dynamically based on the mean value at any given time.

Many of the embodiments described above determine one or more voltage profiles as a function of time to provide a characteristic signature for a battery, with discernible changes in a voltage profile then being used to verify a battery replacement event. Alternatively, it will be appreciated that this approach may instead be used to automatically identify a battery replacement event, even if a step change in voltage magnitude was not detected. There may be some circumstances when a battery has been replaced without a step change being seen in the voltage measurements. According to a further aspect of the present invention, there is provided a method of automatically detecting replacement of a vehicle battery associated with an engine of a vehicle, the method comprising:

obtaining vehicle battery voltage measurements from a voltage monitoring unit connected to or incorporated into a telematics device;
processing the vehicle battery voltage measurements by:
determining a voltage profile as a function of time for at least one given time window chosen from a first time window corresponding to an engine off state, a second time window corresponding to an engine start-up state, and a third time window corresponding to an engine on state;
assessing when the voltage profile undergoes a discernible change over a time period corresponding to multiple instances of the given time window; and
using the discernible change to automatically identify a vehicle battery replacement event.

The engine may be the engine of an Electric Vehicle (EV)/Plug-in Hybrid Electric Vehicle (PHEV). In some embodiments of this further aspect of the invention, the method may further comprise: aggregating multiple voltage profiles determined for the first, second and/or third time windows to determine an overall battery voltage profile; comparing the overall battery voltage profile before the identified battery replacement event with the overall battery voltage profile after the identified battery replacement event; and identifying one or more discernible changes in the overall battery voltage profile before and after the identified battery replacement event to verify the battery replacement event.

In some embodiments of this further aspect of the invention, the method may further comprise: using one or more machine learning or statistical analysis methods to identify one or more discernible changes in a voltage profile before and after the identified battery replacement event to verify the battery replacement event.

In some embodiments of this further aspect of the invention, the discernible change relates to one or more of: a change in minimum resting voltage, or a change in auto-discharge rate for the battery. As described above, the relevant voltage profile characteristics may be determined by the applicable time window. The examples described above apply equally.

In addition to using a discernible change in one or more voltage profiles to automatically identify a battery replacement event, it has been recognised that this approach may in fact enable a wide range of different health-related or state-related events for a vehicle battery to be automatically identified. Discernible changes in battery voltage profiles can be appropriately classified and linked to other events that have an effect on the battery's function. For example, voltage profiles may be used to automatically detect when: a battery has been replaced; one or a set of multiple start-up attempts failed; a battery is not charging or discharging as expected (e.g. due to DC-DC converter issues); a battery has discharged or degraded (e.g. due to detrimental driving behaviour). This approach can be assisted by machine learning or statistical analysis methods, as already mentioned above.

It will further be appreciated that a rising RPM value cannot be used to distinguish a driving phase corresponding to an engine on state for an EV/PHEV. For EVs/PHEVs, two signals can be used to detect a driving phase when the engine is on. From the vehicle CAN bus, the telematics device may read the CAN signal which indicates that the driver has pressed the "power on" button in the EV/PHEV. An acceleration sensor (in the telematics device or in the vehicle) may be further used to detect that the vehicle is moving.

In one or more embodiments of any aspect of the invention disclosed above, the method further comprises: transmitting the battery voltage measurements from the telematics device in a vehicle to an external server. The battery voltage measurements may be time-stamped by a processor of the telematics device before being transmitted. The battery voltage measurements are preferably transmitted in real time. The battery voltage measurements are preferably transmitted continually. In some embodiments, the battery voltage measurements comprise "raw" voltage data received directly from the voltage monitoring unit. In other embodiments, the battery voltage measurements are pre-processed or pre-classified by a processor of the telematics device before being transmitted to the external server.

In some embodiments, the battery voltage measurements transmitted from the telematics device to the server may be stored before being processed according to the methods disclosed herein. In embodiments the method may comprise receiving the battery voltage measurements from the telematics device, and storing battery voltage measurements in a database for use in the methods described herein. The step of obtaining battery voltage measurements may then comprise obtaining the data from the database. It will be appreciated that the battery voltage measurements may be received and stored in a database at a first server and then obtained from the database by another server which implements the methods described herein, or the first server may both receive and store the battery voltage measurements and then carry out the processing according to the methods disclosed herein.

The server (using one or more processors) may be configured to apply one or more algorithms to process the voltage measurements, which algorithm(s) may be easily improved and updated as more data is received at the server, as compared to updating software on a processor of the telematics device or in the vehicle. For example, an algorithm which is used to detect a battery replacement event may be continuously retrained on new incoming voltage measurement data. Over time, as more data is provided from multiple telematics devices, the accuracy of the algorithm for detecting a battery replacement event will improve, without the need to apply updates to software in the telematics devices, which may be costly and time-consuming. In some embodiments, the methods disclosed herein may further comprise: implementing an algorithm to process the vehicle battery voltage measurements in a server remote from the telematics device; and updating the algorithm from time to time.

In any of the aspects and embodiments disclosed herein, the step of processing the battery voltage measurements may be carried out by a set of one or more processors, including at least one processor of the telematics device and/or at least one remote processor, for example a processor at a remote server. A given step may be carried out using the same or a different set of processors to any other step. Any given step may be carried out using a combination of sets of processors. The processing may be shared between processors. In at least some embodiments, the telematics device comprises a transceiver for transmitting the battery voltage measurements to a server for processing. As mentioned above, the server may be better suited to running multiple algorithms, including machine learning algorithms, to assess discernible changes in the voltage measurements as described herein. Some pre-processing or pre-classification may be carried out by a processor in the telematics device. The telematics device may also comprise a memory for storing the battery voltage measurements.

In a set of embodiments, the telematics device comprises a location sensor e.g. a GPS receiver (or any other global navigation satellite system (GNSS) receiver, or equivalent location-determining device), arranged to monitor the location of the vehicle, optionally wherein the location of the vehicle is logged by a processor of the telematics device at the time of an identified battery replacement event. In some embodiments, the location sensor provides location data for the vehicle at all times when the telematics device is obtaining vehicle battery voltage measurements using the voltage monitoring unit. In one or more embodiments, the methods disclosed herein further comprise: transmitting the battery voltage measurements and vehicle location data from the telematics device in a vehicle to an external server. The battery voltage measurements may be location-stamped (an optionally time-stamped) by a processor of the telematics device before being transmitted.

In a set of embodiments, the time and/or date of an identified battery replacement event is also logged by a processor of the telematics device. Alongside the location of the battery replacement event, this temporal information may be transmitted to a server, e.g. for display to the fleet manager. The fleet manger may therefore build up over time an overview of where and when battery replacement events occur. As mentioned above, any of the methods disclosed herein may further comprise: generating a notification of a battery replacement event or other state-related event. In at least some embodiments, the method further comprises: transmitting the notification to one or more display devices associated with the vehicle (optionally via the telematics device), with a driver of the vehicle (e.g. a driver's mobile device), and/or with a vehicle fleet manager (e.g. a fleet manager display device). When a battery replacement event occurs, the fleet manager may be provided with a notification via Mail/Web notification or via SMS. The fleet manager is therefore provided with real-time information as to the location of battery replacement events, and the fleet manager can therefore check that battery replacement events are taking place in approved facilities. Unwanted and unauthorised battery replacement events may therefore be detected in a location which deviates from a typical place, such as a garage or a roadside.

It will be appreciated that if the battery voltage measurements are stored at a server or database remote from the telematics device, the data are safely stored even if the telematics device is disconnected or stops working. Further to this, software at the server can be updated more easily than software used in a processor in the telematics device. If the bulk of the data processing and the more complex calculations are performed by the server, which will have higher processing power than the telematics device, processing of the voltage measurement data may be performed more quickly than processing at the telematics device.

The server may also use additional data, for example environmental data such as weather or temperature data relating to the vehicle, in the statistical analysis and machine learning processes which are used to automatically detect replacement of a vehicle battery. This additional data may not be available at the telematics device, but may be provided directly to the server, for example local temperature data may not be available at the telematics device but may be provided to the server from a weather service. Therefore, in some embodiments, the server is configured to receive environmental data relating to the vehicle which is further used to verify a battery replacement event.

In at least some embodiments, the methods disclosed herein may further comprise: generating a battery status notification, and optionally transmitting the notification to a display device associated with a vehicle fleet manager. If the server detects that a battery is failing and may need replacing soon, a warning may be provided to a user or fleet manager to inform them of the need for a battery change. If a subsequent battery replacement event is then detected, the server may correlate this with the warning which was issued. If the server stores the time/date of the last battery replacement, it may model the battery deterioration and then provide notifications as to when a battery may need replacing in the near future. The starting probability of a vehicle battery can be determined using battery voltage measurements according to known techniques, see e.g. WO 2020/120514, the entire contents of which are hereby incorporated by reference. Such calculations of the starting probability factor for a vehicle battery may benefit from taking into account the time/date of previous battery replacement event(s). Hence the methods disclosed herein may further comprise: determining a starting probability factor for the vehicle battery, indicative of the likelihood that the battery will be capable of starting the engine of the vehicle, based on the vehicle battery voltage measurements and a previously identified vehicle battery replacement event.

According to a main aspect of the invention, there is provided a server arranged to remotely and automatically detect replacement of a vehicle battery associated with a vehicle engine, the server comprising:
a communications device configured to receive vehicle battery voltage measurements from a telematics device in a vehicle, the telematics device connected to or incorporating a voltage monitoring unit for the vehicle battery; and
one or more processors configured to process the vehicle battery voltage measurements by:
monitoring the voltage measurements in a first time window corresponding to an engine off state;
assessing when the voltage measurements in the first time window indicate a step change in voltage magnitude at a given time; and
using the step change to automatically identify a vehicle battery replacement event.

According to another main aspect of the invention, there is provided a system for automatically detecting replacement of a vehicle battery associated with a vehicle engine, the system comprising:
a telematics device in a vehicle, the telematics device connected to or incorporating a voltage monitoring unit for the vehicle battery, a processor and a transceiver; and
an external server arranged to receive vehicle battery voltage measurements from the telematics device in the vehicle;
wherein the external server is configured (e.g. using a processor) to process the vehicle battery voltage measurements by:
monitoring the voltage measurements in a first time window corresponding to an engine off state;
assessing when the voltage measurements in the first time window indicate a step change in voltage magnitude at a given time; and
using the step change to automatically identify a vehicle battery replacement event.

It will be understood that the server being arranged to remotely detect replacement of a vehicle battery means that the server is external to the vehicle, for example a server hosting a fleet management service. The external server is configured to receive vehicle battery voltage measurements from a telematics device in a vehicle, for example by receiving radio communications from a radio transceiver in the telematics device. In the systems disclosed herein, the external server may be arranged to receive vehicle battery voltage measurements from a radio transceiver in the telematics device. The server and/or the system disclosed above may optionally include any of the features already described in relation to embodiments of the corresponding method.

It will be appreciated that the system and server disclosed above may therefore be used to remotely and automatically detect replacement of a vehicle battery associated with an engine in an EV or PHEV.

The server and/or the system according to these main aspects of the invention may optionally include any of the features already described in relation to embodiments of the corresponding method, for example one or more of the method steps disclosed above may be carried out by one or more processors of the server.

In a server as disclosed herein, optionally the telematics device is connected to the vehicle battery to take a power supply from the battery and the one or more processors configured to: register an interruption in the power supply from the battery and assessing whether the step change at a given time coincides with the interruption in the power supply to verify the vehicle battery replacement event.

In a server as disclosed herein, optionally monitoring the voltage measurements in the first time window comprises determining a first voltage profile as a function of time from voltage measurements in multiple instances of the first time window.

In a server as disclosed herein, optionally the one or more processors further configured to: compare the first voltage profile determined before the given time of the step change with the first voltage profile determined after the given time of the step change; and identify a discernible change in the first voltage profile before and after the given time of the step change to identify a different battery and verify the vehicle battery replacement event. Further optionally, wherein the discernible change relates to one or more of: a change in minimum resting voltage, a change in auto-discharge rate for the battery, or a change in at least one cranking or engine start-up characteristic.

In a server as disclosed herein, optionally the server is configured to receive environmental data relating to the vehicle which is further used to verify a battery replacement event.

In a system as disclosed herein, optionally the telematics device comprises a location sensor arranged to monitor the location of the vehicle and the location of the vehicle is logged by the processor at the time of an identified battery replacement event. Such embodiments are already described above.

In a system as disclosed herein, optionally the time and/or date of an identified battery replacement event is logged by the processor. Such embodiments are already described above.

It will be appreciated that the methods in accordance with the present invention may be implemented at least partially using software. It will this be seen that, when viewed from further aspects, the present invention extends to a computer program product comprising computer readable instructions executable to perform any or all of the methods described herein, e.g. when executed on suitable data processing means. The invention also extends to a computer software carrier comprising such software. Such a software carrier could be a physical (or non-transitory) computer readable storage medium embodying the computer readable instructions.

Some general features will now be described that apply equally to any of the aspects and embodiments described hereinabove.

The telematics devices will be understood to include at least the necessary electronic components to enable a telematics function. As already mentioned, the telematics device may comprise a location sensor, such as a GPS receiver (or any other global navigation satellite system (GNSS) receiver, or equivalent location-determining device), and a processor arranged to obtain location data based on measurements from the location sensor. In many embodiments, the telematics device may comprise a transceiver for external communications, for example configured to transmit the vehicle battery voltage measurements (and optionally location data) to a/the remote server. Further electronic components, such as an acceleration sensor or inertial measurement unit, may optionally be included in the telematics device.

It will be understood that the telematics device is mounted in the vehicle, but operates independently of the vehicle engine control unit (ECU) to obtain the vehicle battery voltage measurements. In some embodiments, the telematics device is a mobile device mounted in the vehicle. In some other embodiments, the telematics device is a fixed device mounted in the vehicle, for example plugged into an On-Board Diagnostics (OBD) port. The fixed device may include mechanical and/or electrical mounting means (e.g. for connecting to the power supply from an onboard battery). The telematics device being a fixed device means that it is not intended to be regularly removed and carried by a user in the form of a mobile device, however the fixed device may still be installable and removable rather than being a permanent fixture in the vehicle. In other words, the telematics device may be manufactured by a third party and installed in a vehicle subsequent to its manufacture, for example as part of a fleet management system. The telematics device can therefore be distinguished from any onboard data processing systems installed by the vehicle manufacturer. In various examples, the telematics device may be one of the LINK tracking devices available from Webfleet Solutions B.V.

BRIEF DESCRIPTION OF THE DRAWINGS

One or more non-limiting examples will now be described, by way of example only, and with reference to the accompanying figures in which.

DETAILED DESCRIPTION

Figure 1:
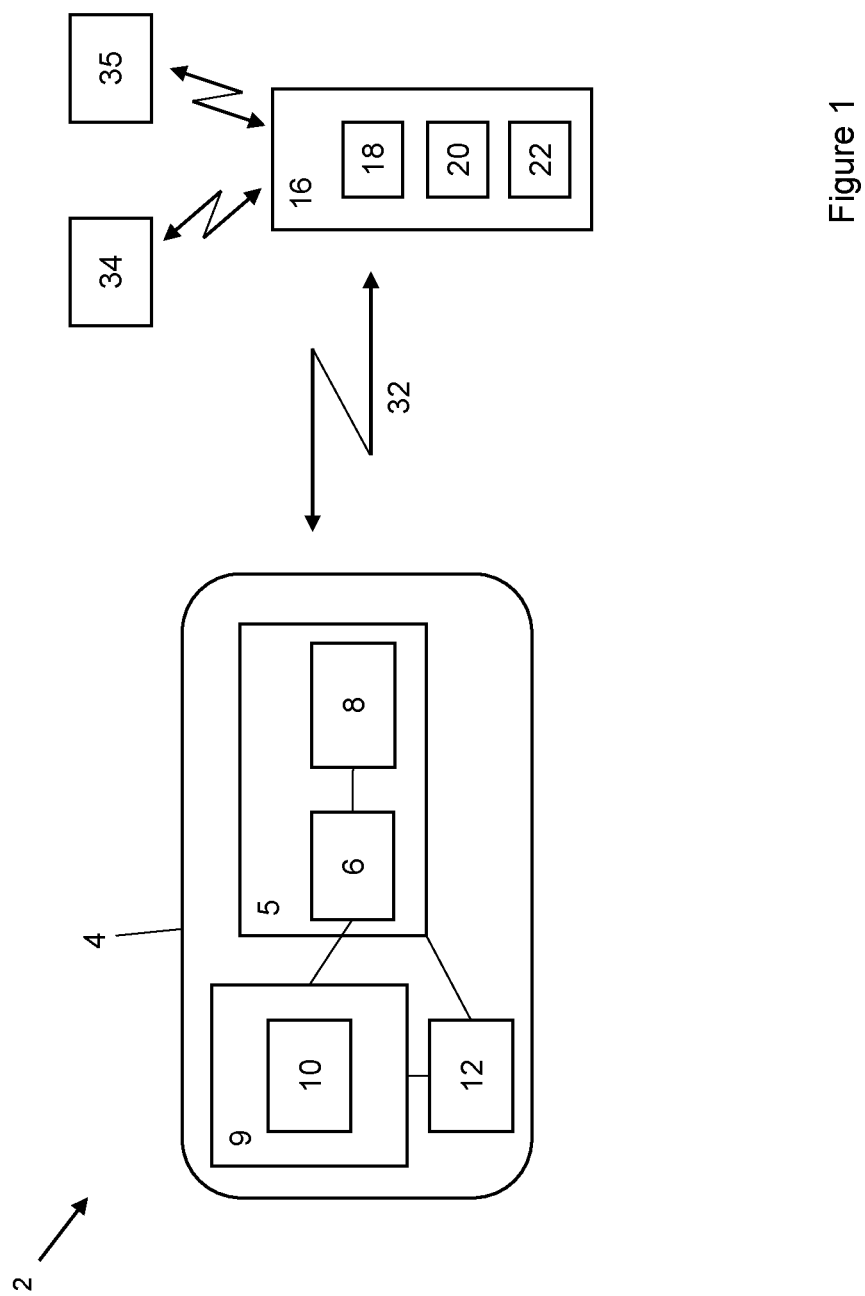
FIG. 1 is a schematic overview of a vehicle including a TCU and an external server which are in communication.

FIG. 1 is a schematic overview of a system 2 which obtains and processes vehicle battery information from a vehicle 4. The vehicle 4 includes an internal combustion engine or electric engine 5, a battery 6 and an alternator (or DC-DC converter for an electric engine) 8 which can charge the battery 6 during operation of the vehicle 4. The vehicle 4 further includes an On-board Diagnostics (OBD) port 9. The OBD port 9 receives vehicle information from various vehicle sensors 12 as is well-known. One or more of the vehicle sensors 12 may be associated with the engine 5 e.g. to collect information such as engine RPM or temperature. The OBD port is connected directly or indirectly to the battery 6 to enable battery voltage measurements to be obtained. A telematics device in the form of a telematics control unit (TCU) 10 is plugged into the OBD port 9 and is in communication with an external server 16 which receives the vehicle battery information. The external server 16 comprises a processor 18, communications device 20 and memory 22. The server 16 is optionally in communication with distributed devices 34, 35 that may be used to display (or otherwise communicate) notifications relating to a vehicle battery replacement event or other state-related event for the vehicle battery.

Figure 2:
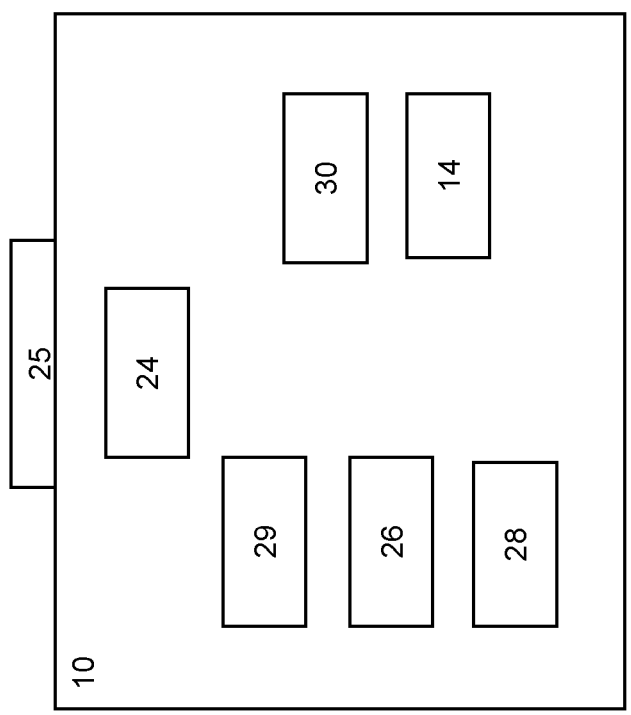
FIG. 2 is a schematic diagram of a TCU.
Figure 3B:
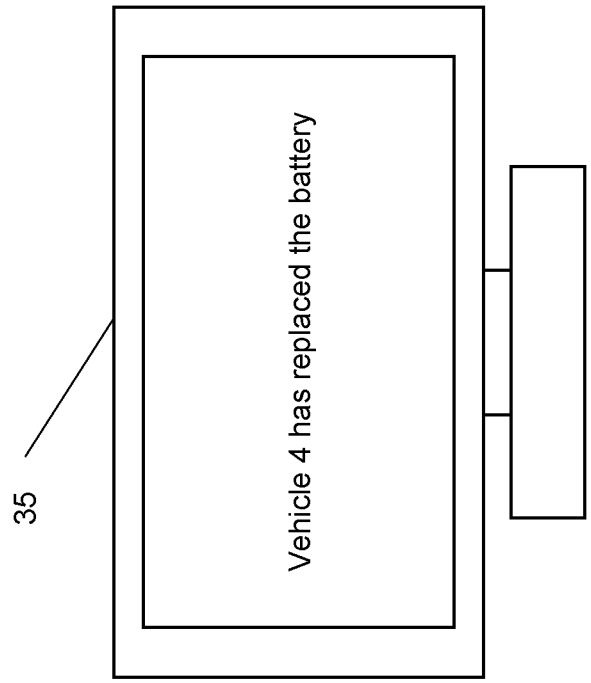
FIG. 3B illustrates an example of information which may be output to a fleet manager in relation to a desktop device.
Figure 3A:
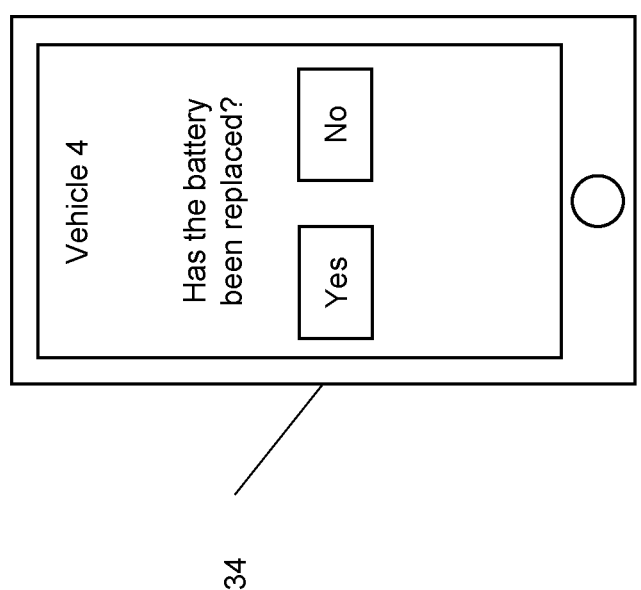
FIG. 3A illustrates an example of information which may be output to a user in relation to a mobile device.

The TCU 10, shown in more detail in FIG. 2, further comprises a power supply 24 and plug 25. The plug 25 connects the TCU 10 to the OBD port 9 such that the TCU 10 receives the vehicle information from the OBD port 9. The power supply 24 may either be provided by the vehicle battery 6 via the plug 25 which connected the TCU 10 to the OBD port 9, or the TCU 10 itself may have its own battery 24. The TCU 10 also comprises a voltage monitoring unit 29, processor 26, memory 28, GPS receiver 30, and transceiver 14 for external communications. The transceiver 14 may, for example, be a radio transceiver configured to send vehicle data 32 (including battery voltage measurements) to the external server communications device 20, where the data 32 may be analysed by the processor 18 in the server 16. The radio transceiver may, for example, comprise a 2G/3G/4G/5G modem. Alternately, data analysis may occur locally with the TCU processor 26, or the analysis may be shared by the two processors 18, 26. Optionally, any notifications which result from this analysis are sent to a display 34 as shown in FIG. 3A which the vehicle's driver can access. The display 34 may be either fixed within a vehicle or remote e.g. a mobile phone. A fleet manager may also have access to a display 35 as shown in FIG. 3B which can be used to inform the fleet manager of vehicle battery replacement events or other battery state-related events. A location of the battery replacement event may be displayed together with the notification.

The TCU 10 may monitor vehicle device information, including battery-relevant information, provided by the vehicle sensors 12 via the OBD port 9. For example, battery-relevant information may include battery current, battery temperature, vehicle speed, alternator/DC-DC converter current, alternator/DC-DC converter voltage etc. The TCU 10 transmits battery voltage measurements, along with any other vehicle information, as data 32 to the remote server 16. The data 32 including battery voltage measurements may be collected during different phases of an engine cycle such as when the vehicle 4 is not in operation (engine off state), during cranking (for an ICE vehicle) or start-up (for EVs) of the engine 5, or during normal operation whilst driving (engine on state). Ideally the battery voltage measurements are obtained regularly so as to monitor the vehicle battery at all times, regardless of vehicle use. Battery voltage measurements are obtained by the voltage monitoring unit 29. In this example the voltage monitoring unit 29 is incorporated into the TCU 10, but in other examples the voltage monitoring unit 29 may be part of the vehicle engine or its on-board diagnostics system, with the voltage measurements being transferred to the TCU 10 via the OBD port 9. The voltage measurements may be collected at different rates depending on the state of the vehicle 4. For example, when the vehicle is not in operation, or resting, the voltage data rate may be once every two hours, with a sampling rate of once every 15 minutes when the vehicle 4 is in operation and is being charged by the alternator (or DC-DC converter) 8. An even higher sampling rate, such as 50-100 Hz, may be used during engine start-up or cranking.

Once collected by the TCU 10, the data 32 which is sent to the external server 16 may be processed and analysed using algorithms and machine learning to automatically identify a vehicle battery replacement event or other state-related event for the vehicle battery 6. For example, the data 32 may be monitored over time to build up one or more voltage profiles for the battery 6. Changes in the battery voltage profile may then be used to identify when the battery 6 in a vehicle 4 has been replaced or another state-related event has occurred. The battery voltage profile may include characteristics such as the minimum resting voltage (which is always the voltage closest to the OCV (Open Circuit Voltage)), the auto-discharge rate, one or more start-up or cranking voltage characteristics, etc. which are extracted from the data 32. Additionally, the usage characteristics of the vehicle 4 and environmental conditions are also typically taken into consideration when assessing the battery voltage profile(s). A starting probability factor for the vehicle battery 6 is optionally calculated, e.g. as disclosed in WO 2020/120514, to assist with generating an advance notification that the battery may need to be replaced.

The GPS receiver 30 may be used to determine the current location of the vehicle to which the TCU 10 is connected. This location data may also be sent from the TCU 10 to the external server 16, and the location of any battery-related events may therefore also be determined, for example allowing a fleet manager to check if a battery was replaced at an approved location.

Figure 4:
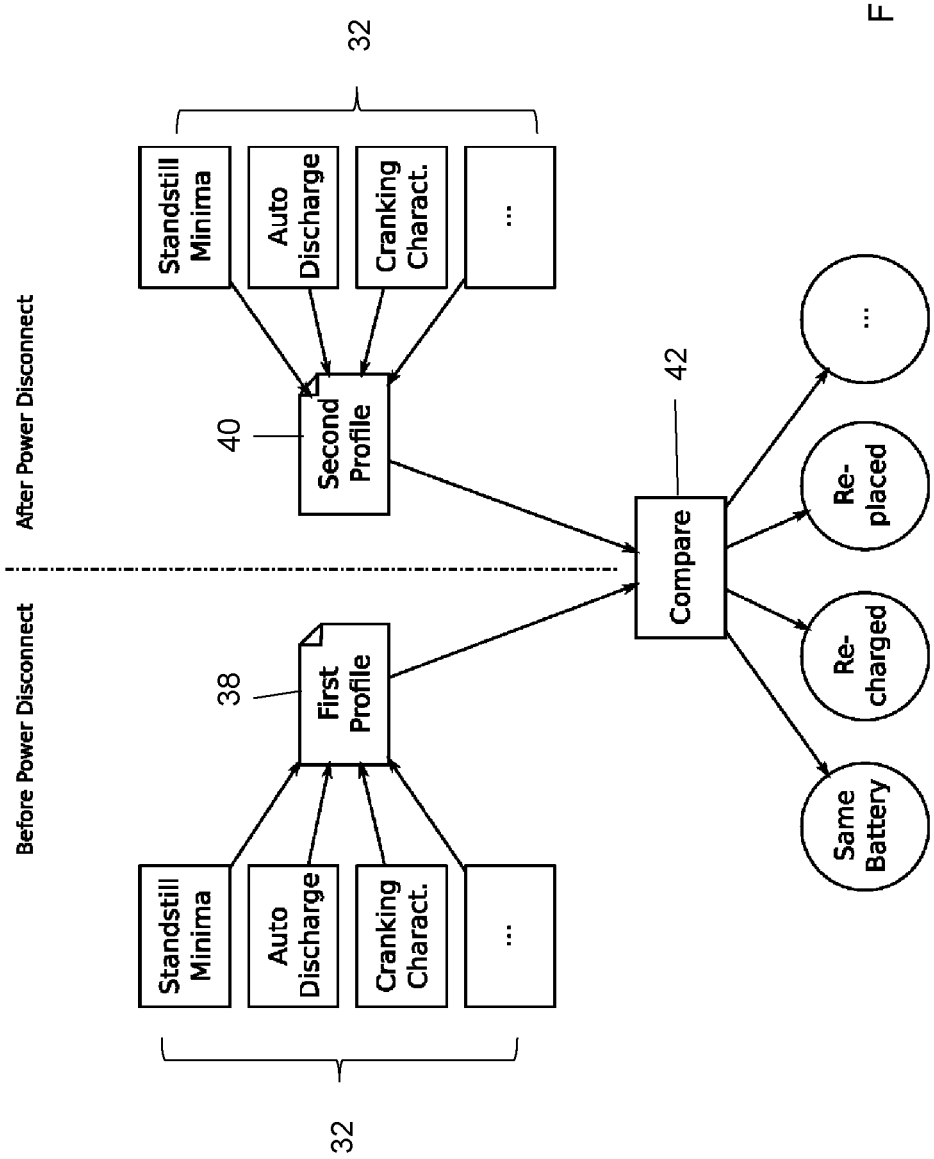
FIG. 4 is a schematic diagram of an exemplary method of monitoring the voltage of a battery (e.g. in an ICE vehicle) before and after a power disconnect event.

FIG. 4 is a schematic diagram illustrating a method of monitoring the voltage of a vehicle battery (e.g. in an ICE vehicle) before and after a power disconnect event. In this example the TCU 10 is powered by the vehicle battery 6, in which case the TCU 10 will not send any data 32 to the external server 16 to be used for battery voltage profiling when the battery is removed. Upon replacement of the battery 6, the TCU 10 will again begin to send data 32 to the sever 16; there will therefore be a first battery voltage profile 38 prior to the power disconnect (i.e. interruption) and a second battery voltage profile 40 after the power disconnect (i.e. interruption) when the (same or different) battery 6 has been replaced.

These two battery voltage profiles 38, 40 may therefore be compared at step 42, as shown in FIG. 4, in order to identify whether after the power disconnect event the same battery is in the vehicle, if the same battery as before has been re-charged, or if the battery has been replaced with a different one. This comparison step 42 may consist of a statistics/machine learning method such as Gaussian-Mixture-Models, Multivariate-T-Student Test, Neural Networks, Cluster-based Local Outlier Factor, Histogram-based Outlier Detection, Isolation Forest, K-Nearest Neighbours, etc. Alternatively, a mean value for the minimal resting voltage could be calculated from the battery data 32 when the vehicle was resting before and after the power disconnect event. The difference in the mean value could be calculated and a threshold applied to detect when there is a step change in the mean value, indicating a different battery. This threshold may be calculated based on battery usage and statistical properties.

Figure 5:
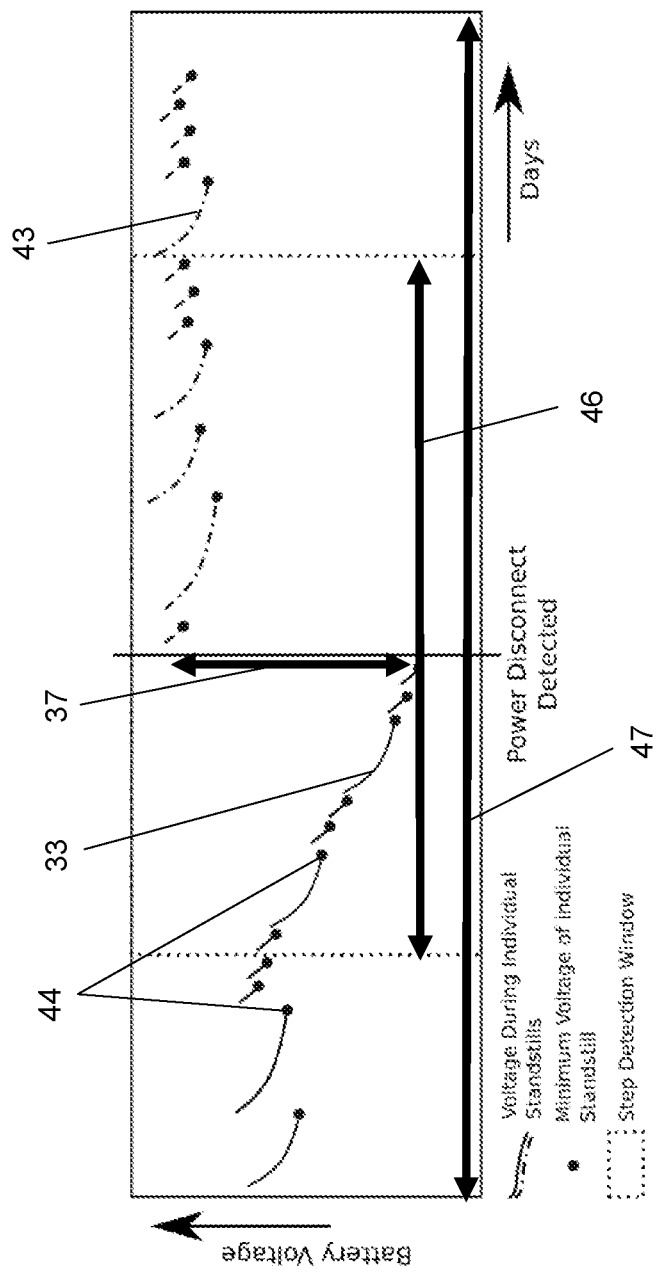
FIG. 5 is a graph showing resting voltages with respect to time of a battery before and after a power disconnect event.

Coinciding with a power disconnect event there is usually a step change 37 in resting voltage magnitude, as shown in FIG. 5. FIG. 5 is a graph of voltage measurements with respect to time, showing resting voltage data 33 (measured in individual time windows each corresponding to an engine off state i.e. during individual "standstills"). Resting voltage data 33 is collected when the engine is off over a time period 47 corresponding to multiple instances of each individual engine off time window. During vehicle resting periods, the voltage of the battery will decrease due to auto-discharge. The resting voltage data 33 before the power disconnect is shown with the solid line, with the resting voltage data 43 after the power disconnect shown with a dashed line. The minimal resting voltage 44 in each instance of the engine off time window may be determined and a step change detection may be executed on the data points in order to identify battery replacement or recharge. The step change 37 in resting voltage before and after the power disconnect event is clear from FIG. 5. The step detection window 46 over which the voltage data 33, 43 is assessed to identify if there has been a step change 37 in resting voltage typically extends over several days (e.g. 3-7 days, for example a minimum of 3-5 days) however this may depend on the usage pattern prior to and after the disconnect. The resting voltage 33, 43 typically varies between 11V and 13.5V for 12V batteries, and 22V and 28V for 24V batteries. These values may be used when setting a threshold to assess when there has been a step change in the resting voltage magnitude.

Even if a power disconnect is not detected, for example because the TCU 10 has its own power supply, the step change 39 in resting voltage data 33, 43 can be used to automatically identify a vehicle battery replacement event. The TCU 10 registering an interruption in power supply can verify a battery replacement event but this is not required.

Figure 6:
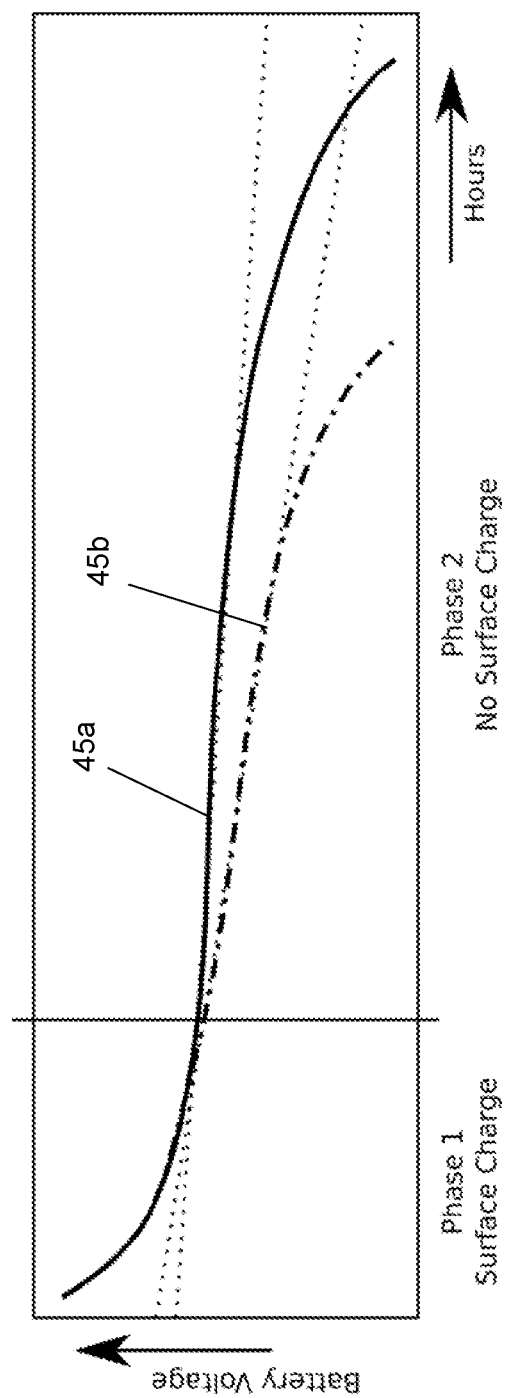
FIG. 6 is a graph showing voltage profiles with respect to time in an engine off state, including the phases of resting voltage and a discernible change being seen for two different batteries.

FIG. 6 provides an example of a first voltage profile 45a, 45b as a function of time in a first time window corresponding to an engine off state, for two different batteries. By monitoring the voltage measurements in multiple instances of the first time window, it is possible to build up a voltage profile 45a, 45b that represents the normal behaviour of the battery and its state of health during engine off i.e. resting periods. The battery resting voltage during each resting period is divided into phases, as shown in FIG. 6. The first phase is influenced by the surface charge which will accumulate when driving the vehicle. The surface charge then reduces until it vanishes—this occurs over several hours e.g. 1-8 hours depending on the environment and usage. This loss of the surface charge marks the beginning of the second phase where the natural auto-discharging of the battery occurs. Through measurement of the slope of the second phase, different batteries and states of batteries may be identified. For example, the solid line in FIG. 6 shows a battery voltage profile 45a for a first battery in a time window corresponding to the engine off state. The dashed line shows a battery voltage profile 45b for a second, different battery in a time window corresponding to the engine off state. Both battery voltage profiles 45a, 45b can be built up from resting voltage measurements in multiple instances of the engine off time window, i.e. across a time period of several days or even months. With reference to FIG. 4, if the profile 45a is a first profile 38 determined before power disconnect and the profile 45b is a second profile 40 determined after power disconnect, then comparing the two voltage profiles 45a, 45b there can be identified a discernible change to thereby identify a different battery and verify that a battery replacement event did coincide with the power disconnect. The same verification can be applied even if a power disconnect or interruption is not registered.

Figure 7:
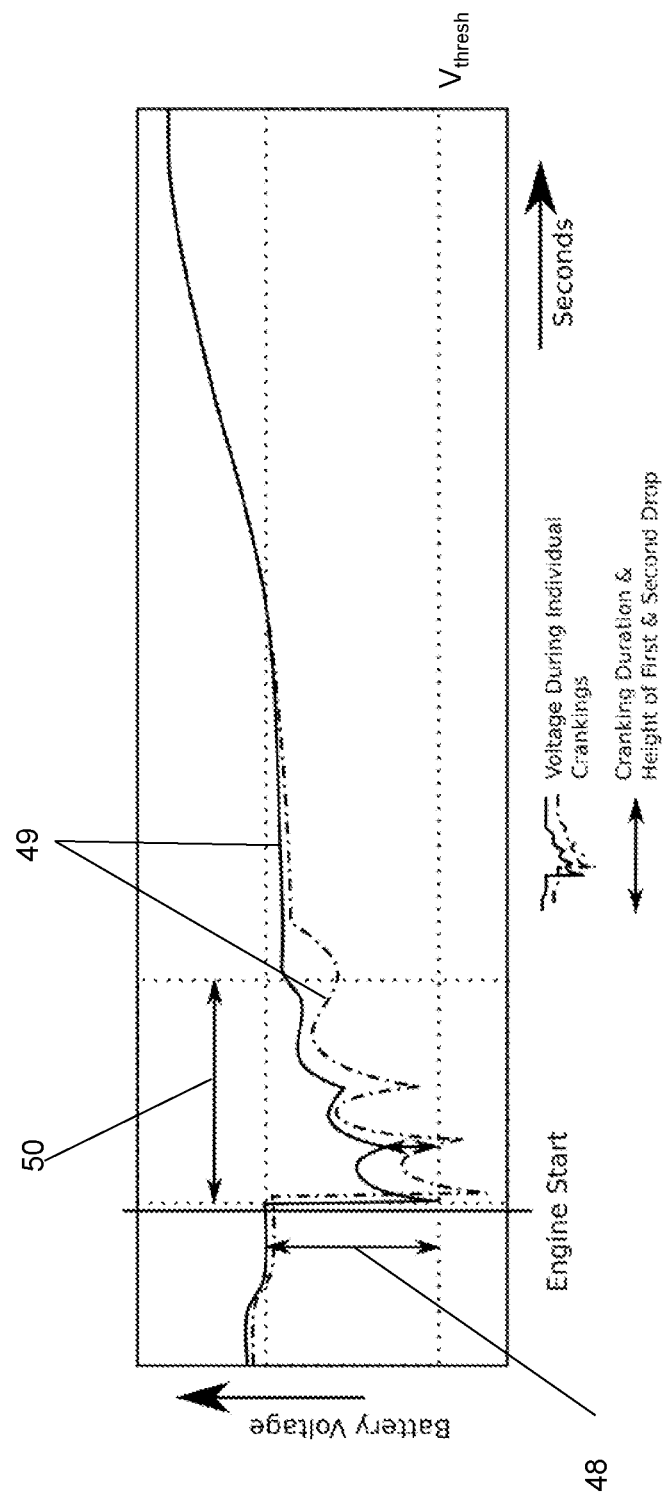
FIG. 7 is a graph showing cranking voltage profiles with respect to time for two different batteries (e.g. in an ICE vehicle)

FIG. 7 is a graph showing a cranking voltage profile 49 with respect to time for two different batteries in ICE vehicles. FIG. 7 shows how the battery voltage prior to engine start has a magnitude corresponding to the open circuit voltage (OCV). Immediately following an engine start event, the voltage drops in magnitude from the OCV to a lower value, resulting in a voltage drop magnitude 48. This initial voltage drop is instantaneous, and should be the lowest voltage measurement during cranking. The voltage drop may be taken to define the start of the engine cranking state. As the engine RPM increases, the load on the electromotor decreases and the battery voltage recovers. There can be seen some local voltage peaks corresponding to the high mechanical resistance induced by the compression process in a four-stroke engine. The cranking duration 50 is the time taken for the voltage to reach a steady state indicating the end of engine start-up. Beyond the period 50, the alternator should start to recharge the battery. This is discussed further below with reference to FIG. 9.

A voltage profile 49 determined from voltage measurements in a time window corresponding to an engine cranking state can indicate the state of health of the battery. The state of health of the battery may be identified from one or more cranking characteristics recognised in the cranking voltage profile. For example, the cranking characteristic comprises at least one of the voltage drop magnitude 48 and cranking duration 50. The cranking duration 50 typically varies from sub-second to several seconds e.g. 0.5-5 seconds. As with the resting voltage data 33, 43 of FIG. 5, the cranking voltage profiles 49 are determined from voltage measurements collected in multiple instances of the cranking time window (i.e. several individual crankings). Further information regarding how a state of health may be assessed for a vehicle battery, based on cranking characteristics, may be found in WO 2020/120514, the contents of which are hereby incorporated by reference.

The resting voltage data shown in FIGS. 5 and 6, alongside the state of health identified from the cranking voltage profile 49, can then be further used in identifying the battery or battery state.

Figure 8:
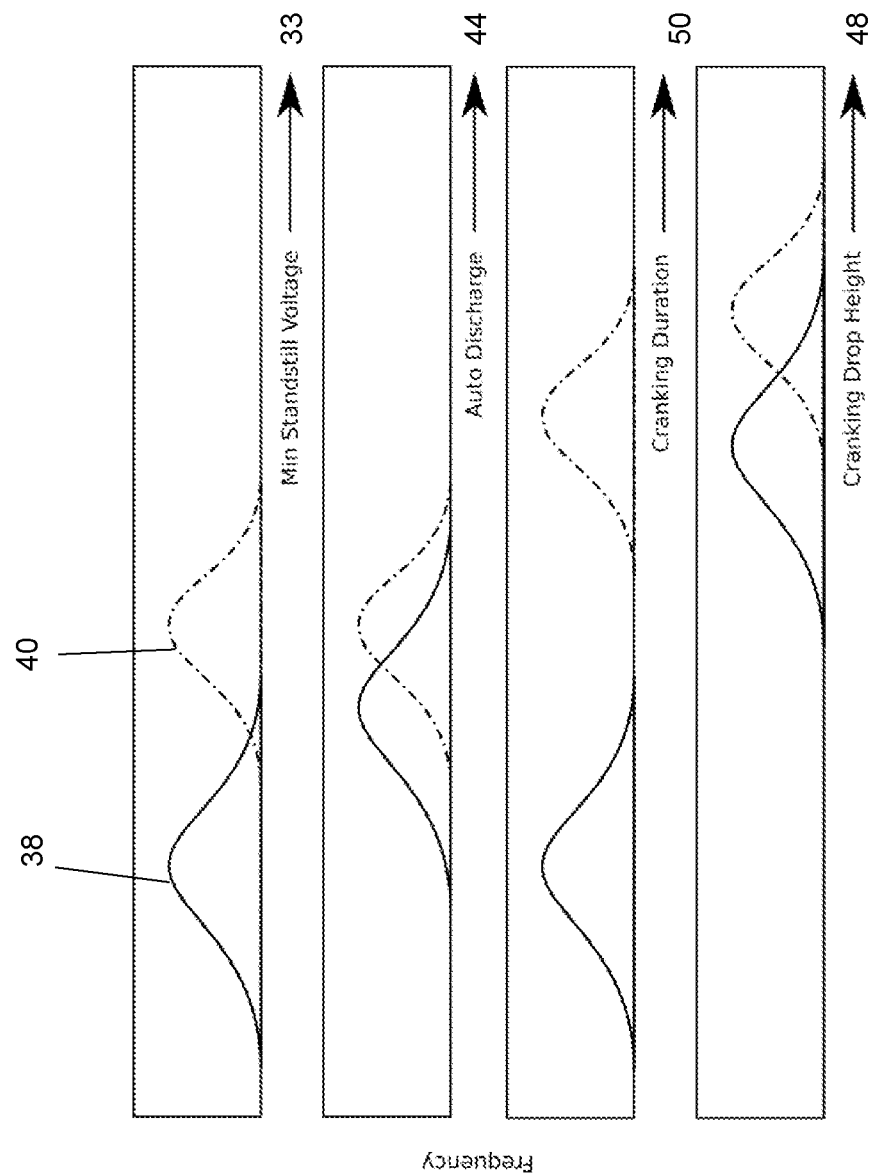
FIG. 8 shows the frequency of some different battery voltage profile characteristics for two different batteries.

FIG. 8 shows the frequency of different characteristics 33, 44, 48, 50 for two different batteries (e.g. in an ICE vehicle). An overall battery voltage profile 38 may be obtained using an aggregation of the characteristics such as the minimal resting voltage data 33, auto-discharge rate 44, and cranking voltage characteristics such as cranking duration data 48 and cranking drop magnitude 50, alongside other factors. The aggregated data may be fed into standard machine learning methods to distinguish if the battery before and after a power disconnect (or otherwise suspected battery replacement event) is the same or if the battery has changed or been exchanged. One example is to execute a t-test to decide if the overall battery voltage profile 38 before, and the overall battery voltage profile 40 after, the power disconnect are statistically different. The t-test will look at the mean and variances to decide if the two distributions 38, 40 are equal or different. The t-test may be tuned to be more or less aggressive to react to small or large changes in voltage profile through setting a lower threshold for the computer p-value to detect more clearly distinct values. An example of differing battery voltage profiles 38, 40 is shown in FIG. 8 where at least some of the battery characteristics 33, 44, 48, 50 diverge, i.e. there is a discernible change, such that the different overall battery voltage profiles 38, 40 are clearly recognised and can be used to verify a battery replacement event.

While the description above has focused so far on automatically identifying a battery replacement event, it will be appreciated that assessing when a battery voltage profile undergoes a discernible change can be used to automatically identify other state-related events for the vehicle battery. With reference to FIG. 8, it can be seen that voltage profiles determined for different time windows (corresponding to different engine states) have been aggregated to determine an overall battery voltage profile 38, 40. The overall battery voltage profile 38 may be determined from historical battery voltage measurements while the overall battery voltage profile 40 may be determined from current battery voltage measurements. By comparing the overall battery voltage profiles 38, 40, is possible to identify one or more discernible changes in the overall battery voltage profile to automatically identify a particular state-related event for the vehicle battery. Examples of identifiable state-related events include: a different battery; a different battery health state; a problematic engine start attempt event for the battery; a charging or discharging issue; an alternator malfunction; or a battery replacement event. These examples will be explained further below.

Figure 9:
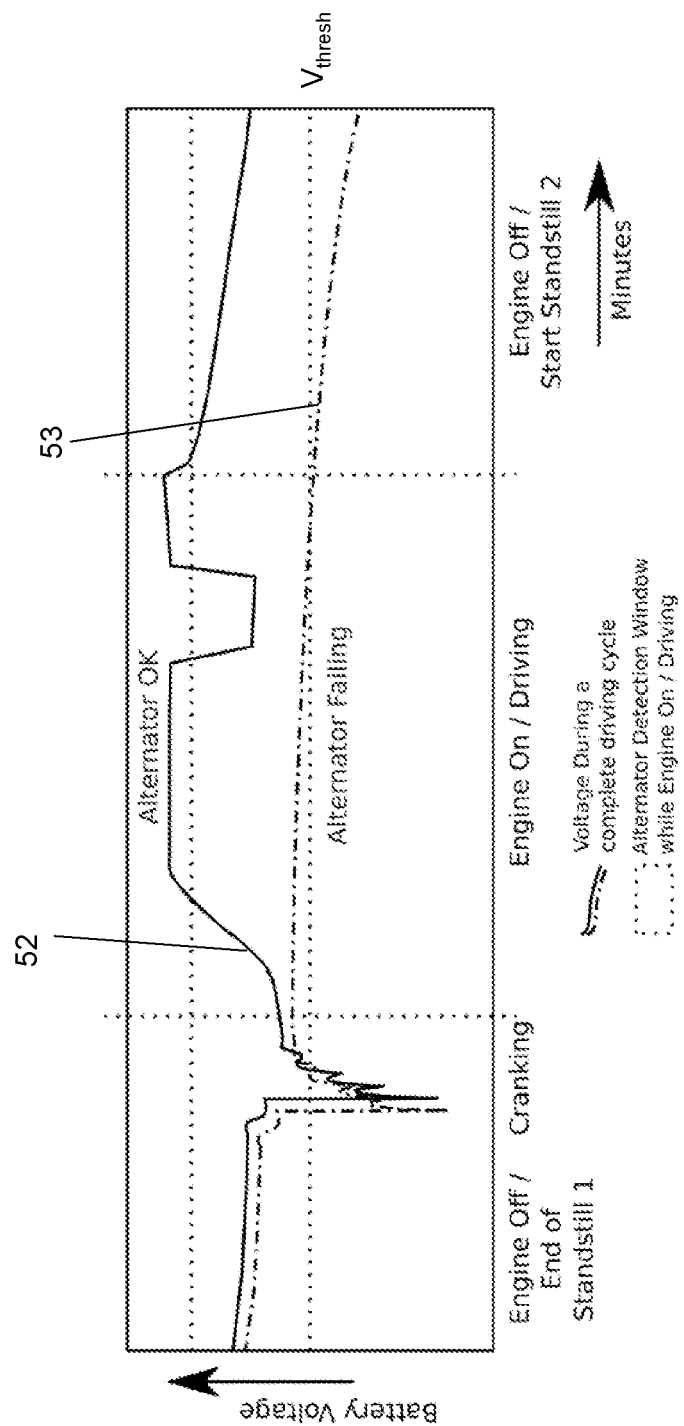
FIG. 9 is a graph showing overall voltage profiles with respect to time for a working and failing vehicle alternator.

FIG. 9 is a graph showing voltage profiles 52, 53 with respect to time for a working and malfunctioning ('failing') vehicle alternator, used to charge a battery in an ICE vehicle. Battery voltage measurements obtained during a driving phase (engine on state) are used to identify if the alternator is working. The voltage profile 52, 53 is determined to identify how often and for how long the voltage magnitude raised over a certain threshold which will indicate a working alternator and to check for any continuous voltage decreases during the driving phase. The engine on/driving phase begins after a successful cranking which will be indicated by a raising voltage. If this value is not available, the beginning of the driving phase may be identified by movement of the vehicle while the ignition is on.

Initially, the algorithm used to process the battery voltage measurements waits for a defined period of time e.g. 20 minutes as the alternator does not charge the battery immediately after the engine is started. If the alternator is not working, then the driving voltage profile 53 will begin to decline over time (in the engine on state) as the battery is continually discharged. If the voltage profile 53 goes beneath a certain threshold $V_{thresh}$ over a minimal period e.g. 20 minutes then an alternator malfunction warning may be generated (and optionally transmitted by the remote server 16 to the display 34 where the vehicle user can be warned). The threshold may be defined dynamically by using the voltage measurements of the resting period (engine off) before driving. If the alternator is working, the voltage profile 52 must increase over a value larger than the minimum voltage 44 of the last resting period. As such, every new voltage measurement in the profile 52 above this threshold which is collected during the driving phase indicated that the alternator is working properly.

Figure 10:
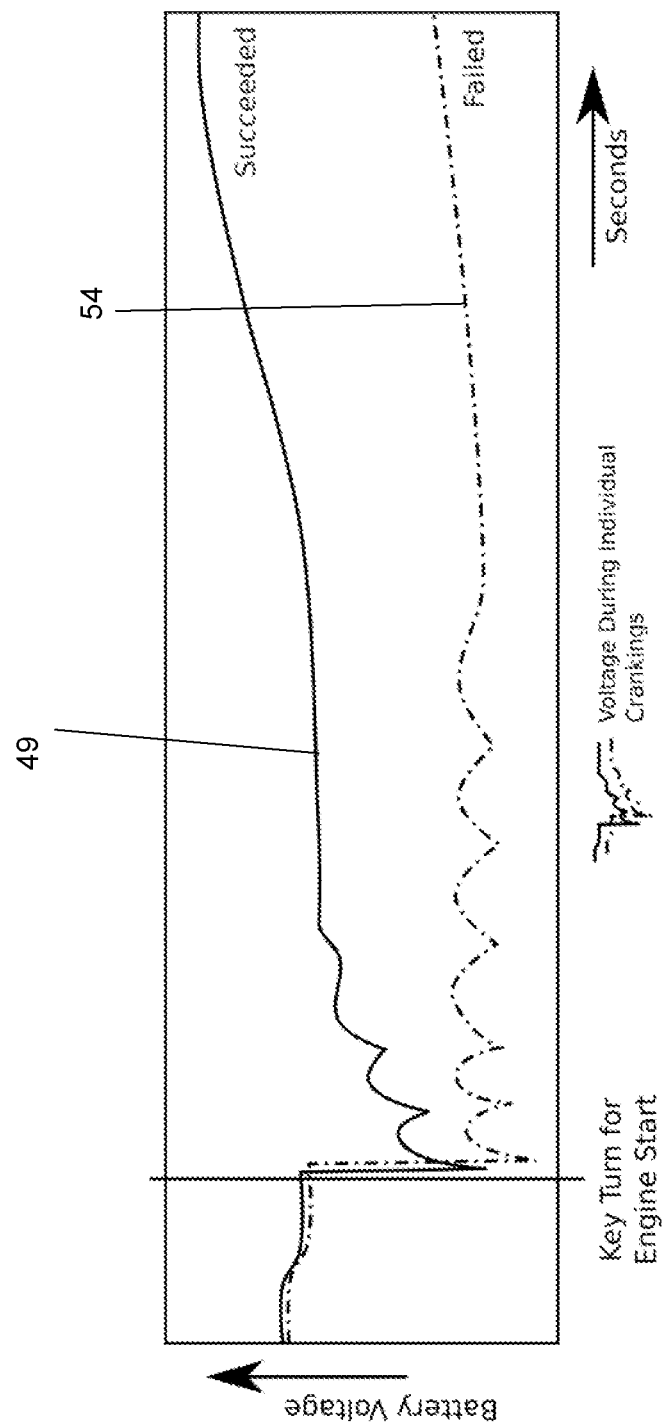
FIG. 10 is a graph showing cranking voltage profiles against time for a successful and failed engine cranking.
Figure 11:
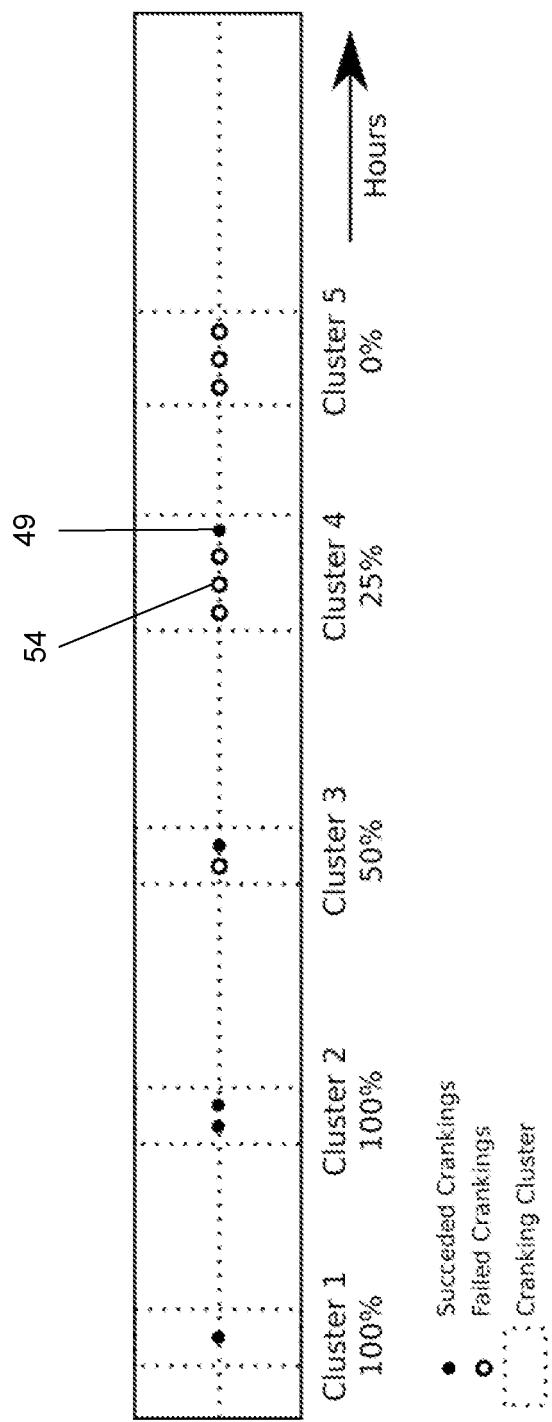
FIG. 11 shows clustering of different engine start attempts against time.

FIG. 10 is a graph showing cranking voltage profiles 49, 54 against time for a successful and failed engine cranking. Cranking problems may be detected through an examination of the success and frequency of crankings. The cranking traces shown in FIG. 10 may be initially classified into a 'succeeded' voltage profile 49, a 'failed' voltage profile 54, or 'unknown', e.g. by the server 16. The classified crankings 49, 54 may then be clustered into groups of engine start attempts. FIG. 11 shows clustering of different engine start attempts against time. Through statistical analysis of the cranking results in each group it is possible to evaluate the difficulty of the engine start attempt and detect a problem.

The cranking traces 49, 54 shown in FIG. 10 are captured during the ignition event with a high sample rate e.g. 100 Hz-50 Hz, with every cranking classified into multiple possible cranking result classes. A successful cranking voltage profile 49 (solid line) and failed cranking voltage profile 54 (dashed line) is shown in FIG. 10. Failed cranking voltage profiles 54 typically have more variation in the lower voltage regions and a much lower voltage at the end of cranking than a successful cranking voltage profile 49. However, this varies and as such, machine learning methods such as Gaussian Mixture Models, Extra Tree Classifiers, Convolutional Neural Networks, Recurrent Neural Networks, Principle Component analysis, Independent Component Analysis are applied to distinguish the result classes. The inputs used for the machine learning methods are the cranking voltage profiles 49, 54 in the time domain and a filtered version of the traces in the frequency domain. A pre-classification on the TCU 10 may also be performed.

Once the cranking voltage profile 49, 54 has been classified, crankings may be clustered into groups of engine start attempts. The clustering occurs in the time domain such that crankings which occur close in time are clustered together, as shown in FIG. 11. This clustering may be carried out using e,g, density-based methods, K-Means etc. An examination of the clusters may be carried out to calculate the success rate per cluster, as shown in FIG. 11, where cluster 4 includes four cranking traces 54 which have been previously classified into successful and failed crankings. As three of the cranking traces 54 in cluster 4 are failed crankings, and one is successful, cluster 4 has a success rate of 25%.

The cluster success rate may then be compared against a threshold success rate e.g. 50%. As cluster 4 has a success rate below 50% then it can be identified as a problematic cluster and a "problematic engine start attempt event" may be generated, and optionally sent to the fleet manager display 35 or the vehicle user display 34.

Figure 12:
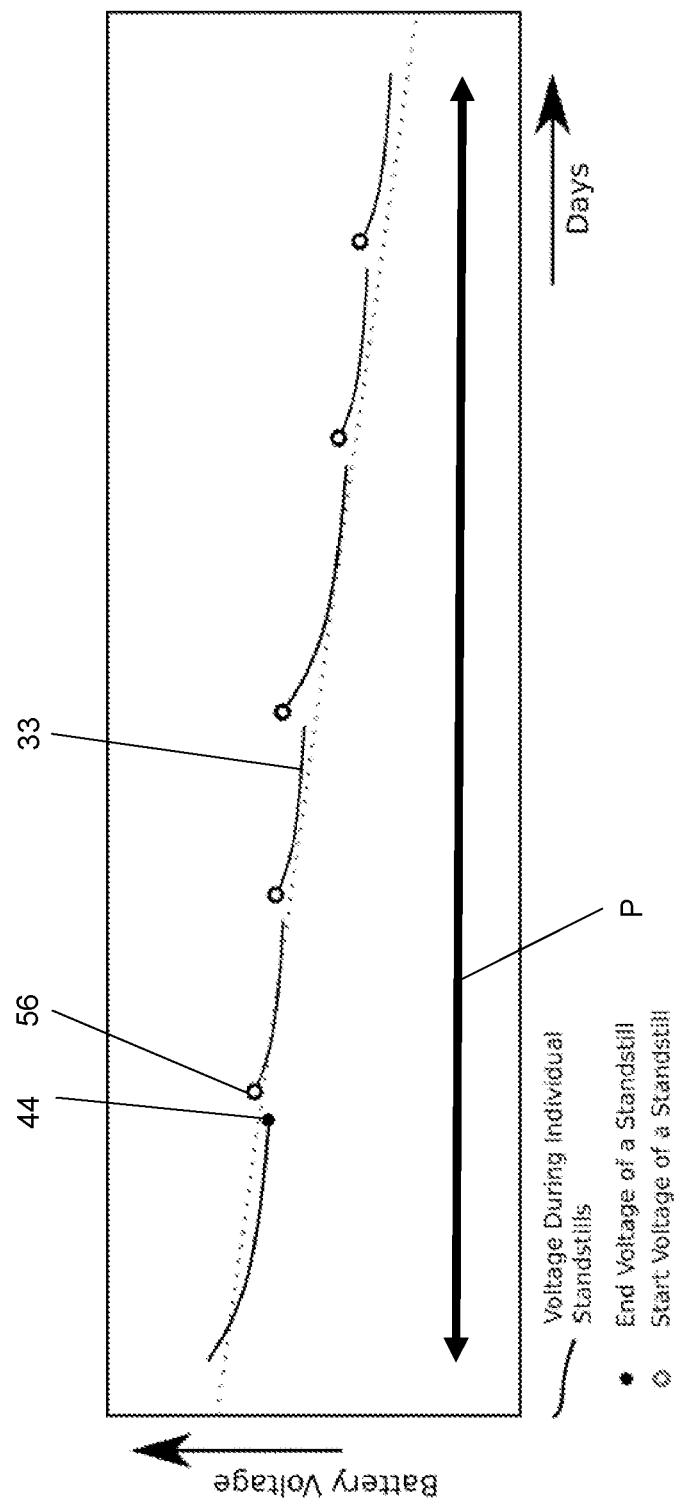
FIG. 12 shows a battery resting voltage profile with respect to time for multiple vehicle resting periods.

FIG. 12 shows battery resting voltage 33 with respect to time for multiple vehicle resting periods (engine off windows), labeled as "standstills". When drivers only use a vehicle regularly in short intervals, there may not be enough driving time to properly recharge the battery. The battery is only charged correctly after a minimum driving time e.g. 25 minutes. Batteries can have different capacities—vehicles with larger batteries typically have stronger alternators, vehicles with smaller batteries typically have weaker alternators, and the minimum driving time for recharge is therefore fairly constant across different capacity batteries.

A driver may only use their vehicle twice a day for 10 minutes e.g. driving a short distance to/from work. In this case, the battery would be constantly discharged over a longer time until there is insufficient charge to start the engine, or the health of the battery has degraded such that the engine cannot start.

Through measurements of the battery resting voltage 33 during resting periods, insufficient driving time can be identified which is an indication of problematic driving behaviour. The maximum voltage 56 of each resting voltage measurement 33 shown in FIG. 12 decreases over time. Resting voltage measurements 33 may be collected over a long time period P e.g. 2 weeks.

A problematic driving behaviour warning may be generated if both:

1. The vehicle is used multiple times over the period P and the car is moved between resting periods; and 2. The resting voltage during the resting periods over the period P constantly decreases without any considerable recovery.

Figure 13:
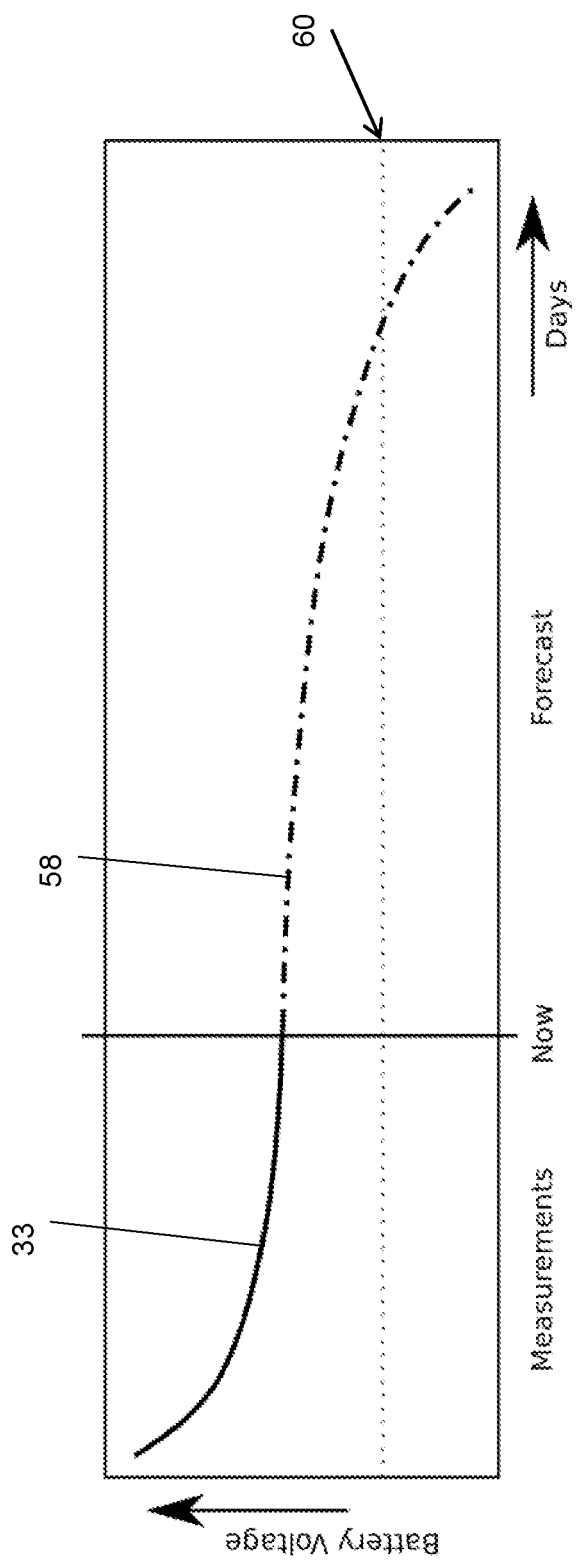
FIG. 13 shows a battery resting voltage profile with respect to time for a vehicle resting period and the predicted future battery resting voltage profile.

Point 1 avoids generation of a warning when the voltage measured decays only due to the long resting period—this is shown in FIG. 13. In point 2 the last measured resting voltage 44 of each resting period is compared to the resting voltage 56 at the start of the next n resting periods. The value of n is chosen dynamically such that at least the next five resting periods and at least the next two days are considered. If none of the next n resting periods begin with a considerably higher voltage e.g. +0.15 V then the resting voltage 33 for that resting period may be considered as non-recovered. If all resting voltages 33 during a period P are considered as non-recovered then a problematic driving behaviour notification may be created (and e.g. sent to the fleet manager display 35 or the vehicle user display 34). The driver may then take measures to avoid battery discharge such as recharging the battery or taking longer trips.

FIG. 13 shows a battery resting voltage profile 33 with respect to time, as determined from voltage measurements in multiple instances of the resting period time window. FIG. 13 further illustrates a predicted future battery resting voltage profile 58. When a vehicle is not driving, the battery naturally auto-discharges over time. If this resting period exceeds weeks or months then the battery may be too discharged to start the engine of the vehicle. If the resting voltage 33 is measured during a resting period then it is possible to detect when the resting voltage 33 drops below a critical level e.g. 12.1 V for a 12 V battery. Detecting when the resting voltage has passed this threshold 60 may not be useful, however, as at this time the battery will already be in a problematic state. An algorithm may therefore be used by the processors 18, 26 to forecast the battery resting voltage 33 during resting periods of the vehicle.

If the vehicle is detected to be standing still for several days e.g. 3 days, the resting voltage measurements 33 taken during those days may be used to forecast the resting voltage profile 58 for a future time period e.g. the next four weeks.

There are at least two ways of forecasting the future resting voltage profile 58:
1. Fitting the data 33 to a two-level exponential decay: $V(t)=V_0(Ae^{-a*t}+Be^{-b*t})$, where A and a correspond to the decay of the surface charges in the first few hours of a resting periods B and b correspond to the auto-discharge of the battery 6.
2. Train a standard machine learning model to the discharging behaviour during a resting period e.g. ARIMA models or a recurrent neural network.

If the processor 18, 26 calculates that the forecasted voltage values will drop below a critical level 60, then a warning may be generated to be displayed on the fleet manager display 35 or the vehicle user display 34 that the vehicle must be moved, or the battery externally charged in order to avoid starting problems in a given period.

Figure 14:
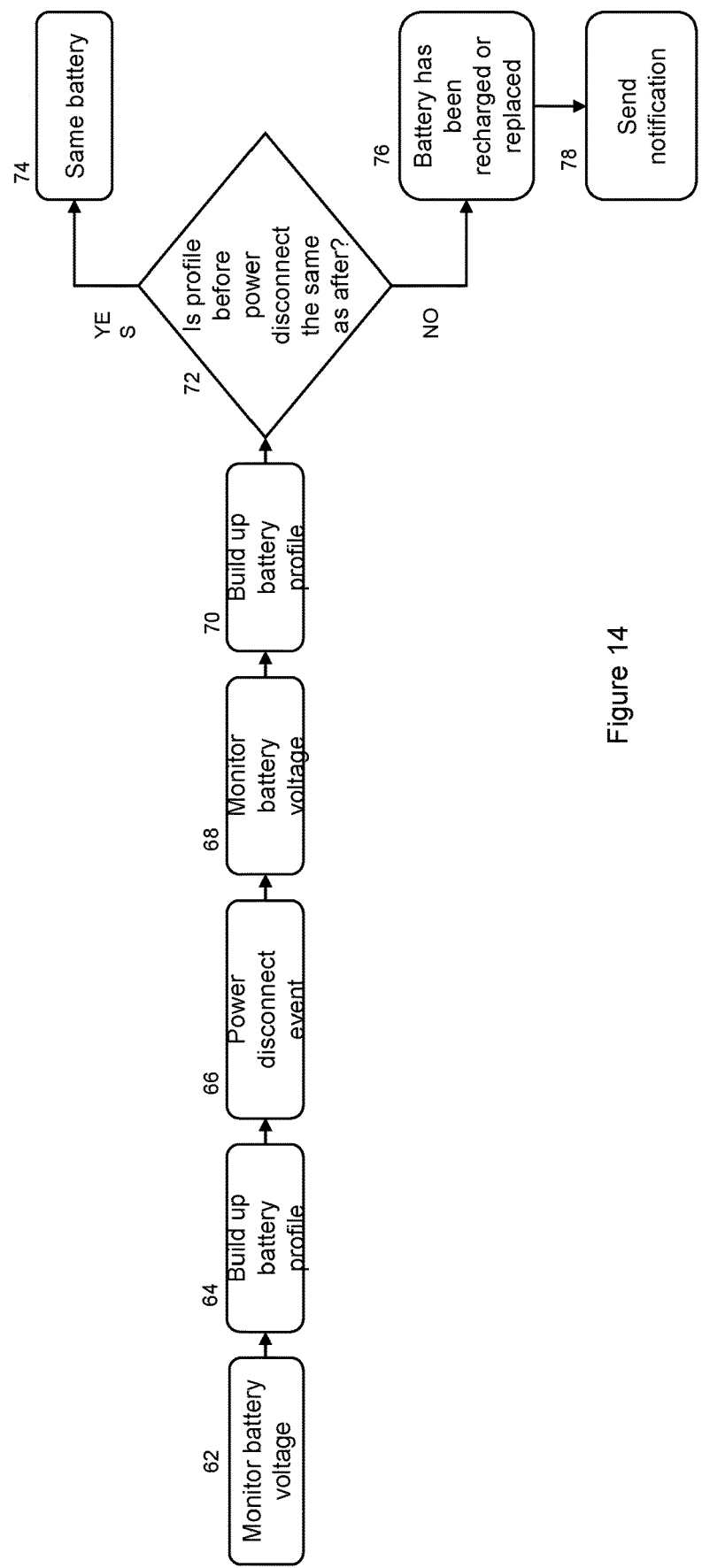
FIG. 14 is a flowchart showing an exemplary method of detecting a vehicle battery replacement event.

FIG. 14 is a flowchart showing a possible method of automatically identifying a battery replacement event through voltage monitoring. In step 62, the battery voltage is monitored—this may be during resting, driving and/or cranking. This voltage data is then aggregated in step 64 to form a battery voltage profile for that specific battery. A power disconnect event is registered in step 66, after which the battery voltage is again monitored in step 68 and used to build up a new battery voltage profile in step 70. The battery voltage profiles before and after the power disconnect event are then compared in step 72. If the voltage profiles are statistically the same, it is determined that the same battery is still in the vehicle. If the battery voltages profiles exhibit one or more discernible changes, as shown in step 76, this may indicate the battery has been recharged or replaced—an appropriate notification may then be generated.

Figure 15:
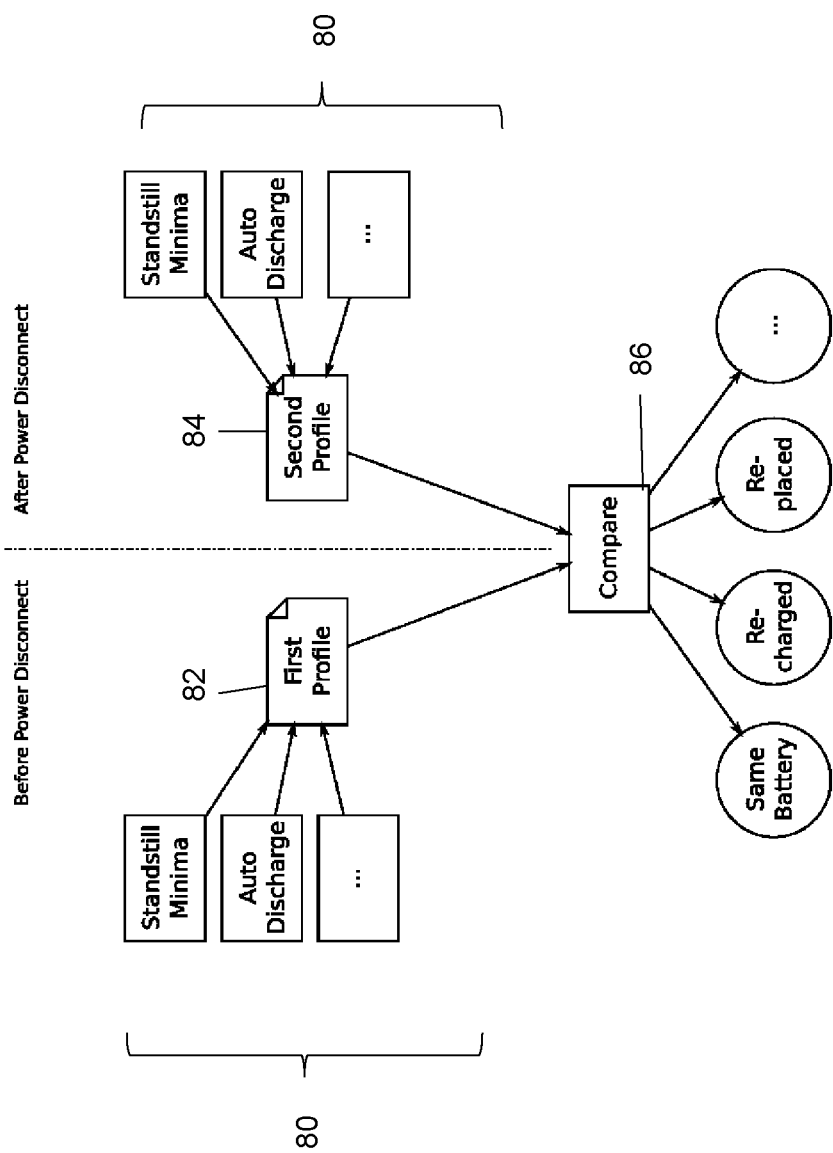
FIG. 15 is a schematic diagram of an exemplary method of monitoring the voltage of a battery in an EV/PHEV before and after a power disconnect event.

FIG. 15 is a schematic diagram illustrating a method of monitoring the voltage of an EV/PHEV vehicle battery before and after a power disconnect event. In this example the TCU 10 is powered by the electric vehicle battery 6, in which case the TCU 10 will not send any data 80 to the external server 16 to be used for battery voltage profiling when the battery is removed. Upon replacement of the battery 6, the TCU 10 will again begin to send data 80 to the sever 16; there will therefore be a first battery voltage profile 82 prior to the power disconnect (i.e. interruption) and a second battery voltage profile 84 after the power disconnect (i.e. interruption) when the (same or different) battery 6 has been replaced.

Compared to the data 32 shown in FIG. 4 for an ICE vehicle, the data 80 does not include the cranking characteristics since for EV/PHEV there is no cranking phase, and thus no cranking characteristics can be measured.

These two battery voltage profiles 82, 84 may therefore be compared at step 86, as shown in FIG. 15, in order to identify whether after the power disconnect event the same battery is in the vehicle, if the same battery as before has been re-charged, or if the battery has been replaced with a different one. This comparison step 86 may consist of a statistics/machine learning method such as Gaussian-Mixture-Models, Multivariate-T-Student Test, Neural Networks, Cluster-based Local Outlier Factor, Histogram-based Outlier Detection, Isolation Forest, K-Nearest Neighbours, etc. Alternatively, a mean value for the minimal resting voltage could be calculated from the battery data 80 when the vehicle was resting before and after the power disconnect event. The difference in the mean value could be calculated and a threshold applied to detect when there is a step change in the mean value, indicating a different battery. This threshold may be calculated based on battery usage and statistical properties.

Figure 16:
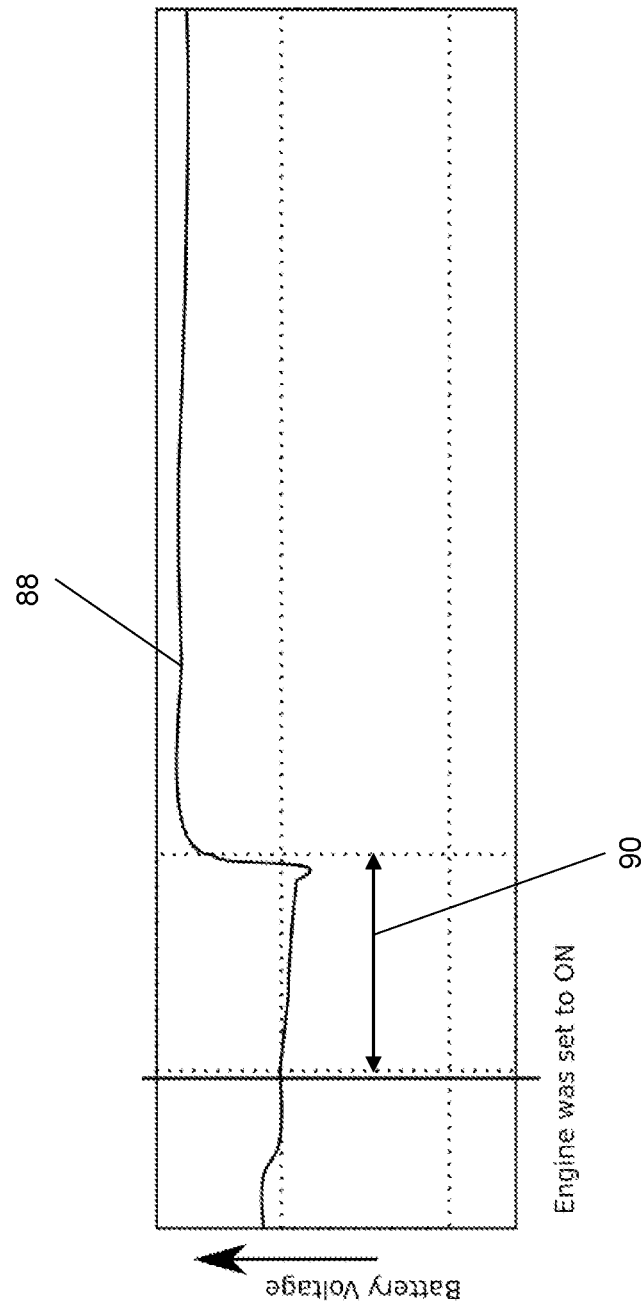
FIG. 16 is a graph showing engine starting voltage profiles with respect to time for a battery in an EV/PHEV.

FIG. 16 is a graph showing an engine start voltage profile 88 with respect to time for a battery in an EV/PHEV. FIG. 16 shows how the battery voltage prior to engine start (ON) has a magnitude corresponding to the open circuit voltage (OCV). The engine start-up phase has a duration 90, which is the time taken for the voltage to reach a steady state indicating the end of engine start-up. Beyond the period 90, the DC-DC converter should start to recharge the battery. This is discussed further below with reference to FIG. 17. It is clear that for an EV/PHEV engine battery, there is no cranking phase, compared to the cranking voltage profiles shown in FIG. 7 for an ICE vehicle battery.

A voltage profile 88 determined from voltage measurements in a time window corresponding to an engine starting state can indicate the state of health of the battery. The state of health of the battery may be identified from engine starting characteristics recognised in the starting voltage profile. For example, the starting characteristic comprises the engine start-up duration 90. The engine start-up duration 90 typically varies from sub-second to several seconds e.g. 0.5-5 seconds. As with the cranking voltage profiles 49 of FIG. 7, the engine starting profiles are determined from voltage measurements collected in multiple instances of the engine start-up time window (i.e.

several individual engine start-ups). The state of health identified from the engine start-up voltage profile 88 can then be further used in identifying the battery or battery state.

Figure 17:
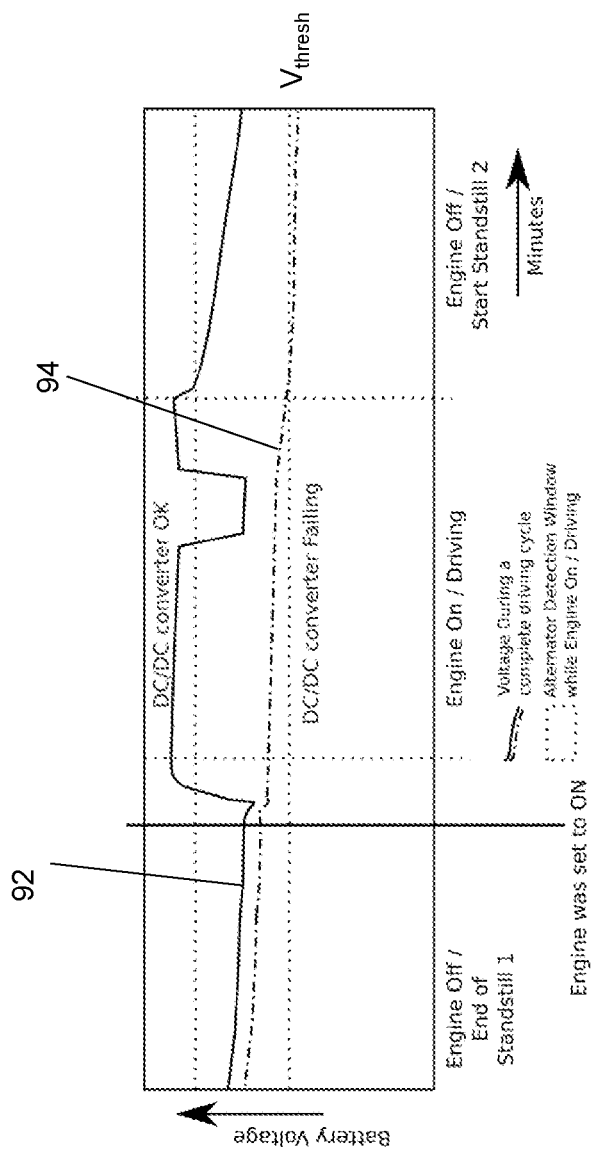
FIG. 17 is a graph showing overall voltage profiles with respect to time for a working and failing DC-DC converter for an EV/PHEV.

FIG. 17 is a graph showing voltage profiles 92, 94 with respect to time for a working and malfunctioning ('failing') vehicle DC-DC converter (such as a 12V DC-DC converter), used to charge a battery in an EV/PHEV. Battery voltage measurements obtained during a driving phase (engine on state) are used to identify if the DC-DC converter is working. The voltage profile 92, 94 is determined to identify how often and for how long the voltage magnitude raised over a certain threshold which will indicate a working DC-DC converter and to check for any continuous voltage decreases during the driving phase. The engine on/driving phase begins when the engine is turned on, which will be indicated by a rising voltage. If this value is not available, the beginning of the driving phase may be identified by movement of the vehicle while the ignition is on.

Initially, the algorithm used to process the battery voltage measurements waits for a defined period of time e.g. 20 minutes as the DC-DC converter does not charge the battery immediately after the engine is started. If the alternator is not working, then the driving voltage profile 94 will begin to decline over time (in the engine on state) as the battery is continually discharged. If the voltage profile 94 goes beneath a certain threshold $V_{thresh}$ over a minimal period e.g. 20 minutes then a DC/DC converter malfunction warning may be generated (and optionally transmitted by the remote server 16 to the display 34 where the vehicle user can be warned). The threshold may be defined dynamically by using the voltage measurements of the resting period (engine off) before driving. If the DC/DC converter is working, the voltage profile 52 must increase over a value larger than the minimum voltage of the last resting period. As such, every new voltage measurement in the profile 92 above this threshold which is collected during the driving phase indicated that the alternator is working properly.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A system arranged to remotely and automatically detect replacement of a vehicle battery associated with a vehicle engine, the system comprising:
   a communications device configured to receive vehicle battery voltage measurements from a telematics device in a vehicle, the telematics device connected to or incorporating a voltage monitoring unit for the vehicle battery; and
   one or more processors configured to process the vehicle battery voltage measurements by:
      monitoring the voltage measurements in a first time window corresponding to an engine off state by determining a first voltage profile as a function of time from voltage measurements in multiple instances of the first time window;
      assessing when the voltage measurements in the first time window indicate a step change in voltage magnitude at a given time;
      using the step change to automatically identify a vehicle battery replacement event;
      comparing the first voltage profile determined before the given time of the step change with the first voltage profile determined after the given time of the step change; and
      identifying a discernible change in the first voltage profile before and after the given time of the step change to identify a different battery and verify the vehicle battery replacement event.

2. The system of claim 1, wherein the telematics device is connected to the vehicle battery to take a power supply from the battery and the one or more processors configured to:
   register an interruption in the power supply from the battery and assessing whether the step change at a given time coincides with the interruption in the power supply to verify the vehicle battery replacement event.

3. The system of claim 1, wherein the discernible change relates to one or more of:
   a change in minimum resting voltage,
   a change in auto-discharge rate for the battery, or
   a change in at least one cranking or engine start-up characteristic.

4. The system of claim 1, wherein the one or more processors are configured to receive environmental data relating to the vehicle which is further used to verify a battery replacement event.

5. The system of claim 1, comprising:
   a telematics device in a vehicle, the telematics device connected to or incorporating a voltage monitoring unit for the vehicle battery, a processor and a transceiver; and
   an external server comprising the communications device and the one or more processors configured to process the vehicle battery voltage measurements from the telematics device in the vehicle.

6. The system of claim 5, wherein the telematics device comprises a location sensor arranged to monitor the location of the vehicle and the location of the vehicle is logged by the processor at the time of an identified battery replacement event.

7. The system of claim 5, wherein the time and/or date of an identified battery replacement event is logged by the processor.

8. A method of monitoring a voltage of a vehicle battery, the method comprising:
   obtaining vehicle battery voltage measurements regularly from a voltage monitoring unit connected to or incorporated into a telematics device, so as to monitor the vehicle battery voltage at all times, regardless of vehicle use; and
   processing the vehicle battery voltage measurements by:
      determining a voltage profile as a function of time for multiple time windows comprising a first time window corresponding to an engine off state, a second time window corresponding to an engine start-up state, and a third time window corresponding to an engine on state;
      assessing, for each of the first, second and third time windows, when the voltage profile as a function of time for a given one of the first, second and third time windows undergoes a discernible change over a time period corresponding to multiple instances of the given time window; and
      using the discernible change to automatically identify a state-related event for the vehicle battery.

9. The method of claim 8, further comprising:
   aggregating the voltage profiles determined for each of the first, second and third time windows to determine an overall battery voltage profile;
   comparing the overall battery voltage profile determined from historical battery voltage measurements with the overall battery voltage profile determined from current battery voltage measurements; and
   identifying one or more discernible changes in the overall battery voltage profile to automatically identify the state-related event for the vehicle battery.

10. The method of claim 8, wherein assessing the voltage profile for each of the first, second and third time windows comprises using one or more machine learning or statistical analysis methods to recognise a discernible change and classify each discernible change according to an effect of the respective discernible change on a given voltage profile, and wherein the discernible change is classified as one of:
   a change in auto-discharge rate for the battery in one of more of the first, second and third time windows;
   a change in minimum resting voltage in the first time window;
   a change relating to an ongoing reduction in mean or minimum resting voltage in the first time window;
   a step change in voltage magnitude in the first time window;
   a change relating to at least one start-up or cranking characteristic in the second window;
   a change relating to a reduction in voltage magnitude in the third time window; or
   a change relating to a continuous negative gradient in the voltage profile in the third time window.

11. The method of claim 10, wherein classification of the discernible change is used to automatically identify the state-related event for the vehicle battery chosen from:
   a different battery;
   a different battery health state;
   a problematic engine start attempt event for the battery;
   a charging or discharging issue;

an alternator malfunction;

a DC-DC converter malfunction; or a battery replacement event.

12. The method of claim 8, further comprising:

generating a notification of the state-related event and transmitting the notification to one or more devices associated with a vehicle fleet manager.

13. The method of claim 8, further comprising:

transmitting the battery voltage measurements from the telematics device in a vehicle to an external server where a processor is configured to implement said processing of the vehicle battery voltage measurements.

14. A method of automatically detecting replacement of a vehicle battery associated with a vehicle engine, the method comprising:

obtaining vehicle battery voltage measurements from a voltage monitoring unit connected to or incorporated into a telematics device;

processing the vehicle battery voltage measurements by:

monitoring the voltage measurements in a first time window corresponding to an engine off state by determining a first voltage profile as a function of time from voltage measurements in multiple instances of the first time window;

assessing when the voltage measurements in the first time window indicate a step change in voltage magnitude at a given time; and using the step change to automatically identify a vehicle battery replacement event;

comparing the first voltage profile determined before the given time of the step change with the first voltage profile determined after the given time of the step change; and identifying a discernible change in the first voltage profile before and after the given time of the step change to identify a different battery and verify the vehicle battery replacement event.

15. The method of claim 14, wherein the telematics device is connected to the vehicle battery to take a power supply from the battery and the method further comprises:

registering an interruption in the power supply from the battery and assessing whether the step change at a given time coincides with the interruption in the power supply to verify the vehicle battery replacement event.

16. The method of claim 14, further comprising:

transmitting the battery voltage measurements from the telematics device in a vehicle to an external server where a processor is configured to implement said processing of the vehicle battery voltage measurements.

* * * * *